(12) United States Patent
Chen

(10) Patent No.: US 8,970,047 B2
(45) Date of Patent: Mar. 3, 2015

(54) METHOD FOR CREATING A 3D STACKED MULTICHIP MODULE

(71) Applicant: Macronix International Co., Ltd., Hsinchu (TW)

(72) Inventor: Shih-Hung Chen, Jhudong Township (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/465,721

(22) Filed: Aug. 21, 2014

(65) Prior Publication Data

US 2014/0363922 A1 Dec. 11, 2014

Related U.S. Application Data

(62) Division of application No. 13/451,411, filed on Apr. 19, 2012, now Pat. No. 8,836,137.

(51) Int. Cl.
*H01L 23/48* (2006.01)
*H01L 23/495* (2006.01)
(Continued)

(52) U.S. Cl.
CPC ............ *H01L 25/50* (2013.01); *H01L 21/6835* (2013.01); *H01L 2225/06548* (2013.01)
USPC ............ 257/774; 257/670; 257/689; 438/107

(58) Field of Classification Search
CPC ...................................................... H01L 25/50
USPC .................. 257/774, 686, E21.577, E23.011; 438/107, 109
See application file for complete search history.

(56) References Cited

U.S. PATENT DOCUMENTS

| 6,034,882 A | 3/2000 | Johnson et al. |
| 6,906,361 B2 | 6/2005 | Zhang |

(Continued)

FOREIGN PATENT DOCUMENTS

| EP | 1936681 A1 | 6/2008 |
| EP | 2048709 A2 | 4/2009 |
| EP | 2192612 A2 | 6/2010 |

OTHER PUBLICATIONS

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

(Continued)

*Primary Examiner* — Long K Tran
*Assistant Examiner* — Dzung Tran
(74) *Attorney, Agent, or Firm* — James F. Hann; Haynes Beffel & Wolfeld LLP

(57) ABSTRACT

A 3D stacked multichip module comprises a stack of W IC die. Each die has a patterned conductor layer, including an electrical contact region with electrical conductors and, in some examples, device circuitry over a substrate. The electrical conductors of the stacked die are aligned. Electrical connectors extend into the stack to contact landing pads on the electrical conductors to create a 3D stacked multichip module. The electrical connectors may pass through vertical vias in the electrical contact regions. The landing pads may be arranged in a stair stepped arrangement. The stacked multichip module may be made using a set of N etch masks with $2^{N-1}$ being less than W and $2^N$ being greater than or equal to W, with the etch masks alternatingly covering and exposing $2^{n-1}$ landing pads for each mask n=1, 2 . . . N.

12 Claims, 21 Drawing Sheets

(51) Int. Cl.
  *H01L 21/00* (2006.01)
  *H01L 25/00* (2006.01)
  *H01L 21/683* (2006.01)

(56) References Cited

U.S. PATENT DOCUMENTS

| | | |
|---|---|---|
| 6,906,940 B1 | 6/2005 | Lue |
| 7,081,377 B2 | 7/2006 | Cleeves |
| 7,129,538 B2 | 10/2006 | Lee et al. |
| 7,177,169 B2 | 2/2007 | Scheuerlein |
| 7,274,594 B2 | 9/2007 | Pascucci et al. |
| 7,315,474 B2 | 1/2008 | Lue |
| 7,382,647 B1 | 6/2008 | Gopalakrishnan |
| 7,420,242 B2 | 9/2008 | Lung |
| 7,851,849 B2 | 12/2010 | Kiyotoshi |
| 8,836,137 B2 | 9/2014 | Chen |
| 2004/0188822 A1 | 9/2004 | Hara |
| 2005/0280061 A1 | 12/2005 | Lee |
| 2007/0045708 A1* | 3/2007 | Lung ............... 257/314 |
| 2007/0140001 A1 | 6/2007 | Motoi et al. |
| 2008/0073635 A1 | 3/2008 | Kiyotoshi et al. |
| 2008/0096327 A1 | 4/2008 | Lee et al. |
| 2008/0101109 A1 | 5/2008 | Haring-Bolivar et al. |
| 2008/0175032 A1 | 7/2008 | Tanaka et al. |
| 2008/0180994 A1 | 7/2008 | Katsumata et al. |
| 2008/0247230 A1 | 10/2008 | Lee et al. |
| 2008/0285350 A1 | 11/2008 | Yeh |
| 2009/0001530 A1 | 1/2009 | Goto |
| 2009/0032966 A1 | 2/2009 | Lee et al. |
| 2009/0097321 A1 | 4/2009 | Kim et al. |
| 2009/0184360 A1 | 7/2009 | Jin et al. |
| 2010/0007001 A1* | 1/2010 | Wang et al. ............... 257/686 |
| 2010/0054015 A1 | 3/2010 | Lee et al. |
| 2010/0109164 A1* | 5/2010 | Kang et al. ............... 257/774 |
| 2010/0182041 A1* | 7/2010 | Feng et al. ............... 326/38 |
| 2010/0225000 A1 | 9/2010 | Sugizaki et al. |
| 2010/0270593 A1 | 10/2010 | Lung et al. |
| 2011/0057321 A1 | 3/2011 | Wang et al. |
| 2013/0075802 A1* | 3/2013 | Chen et al. ............... 257/314 |

OTHER PUBLICATIONS

Feb. 5, 2013 Extended European Search Report for related application EP 12170759, 12 pp.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al., "Three Dimensionally Stacked NAND Flash Memory Technology Using Stacking Single Crystal Si Layers on ILD and TANOS Structure for Beyond 30nmNode," IEEE IEDM Dec. 11-13, 2006, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lai et al., "Highly Reliable MA BE-SONOS (Metal-Al2 O3 Bandgap Engineered SONOS) Using a SiO2 Buffer Layer,"VLSI Technology, Systems and Applications, 2008, VLSI-TSA 2008 International Symposium on Apr. 21-23, 2008, pp. 58-59.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Paul et al., "Impact of a Process Variation on Nanowire and Nanotube Device Performance," IEEE Trans. on Electron Devices, vol. 54, No. 9, Sep. 2007, pp. 2369-2376.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

* cited by examiner

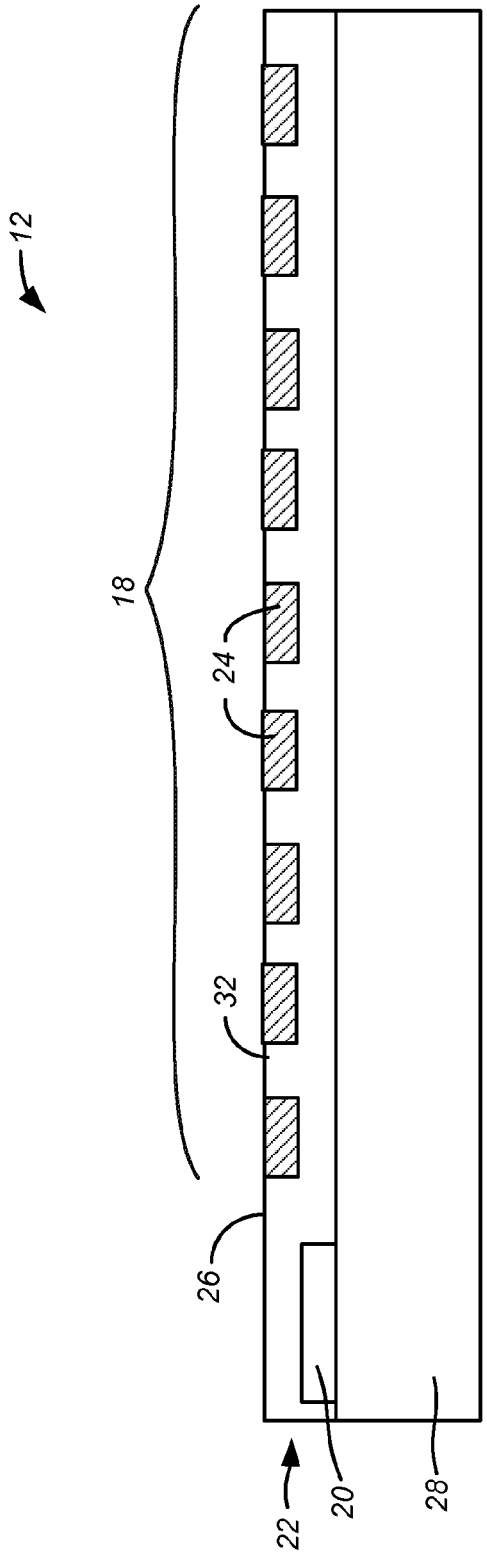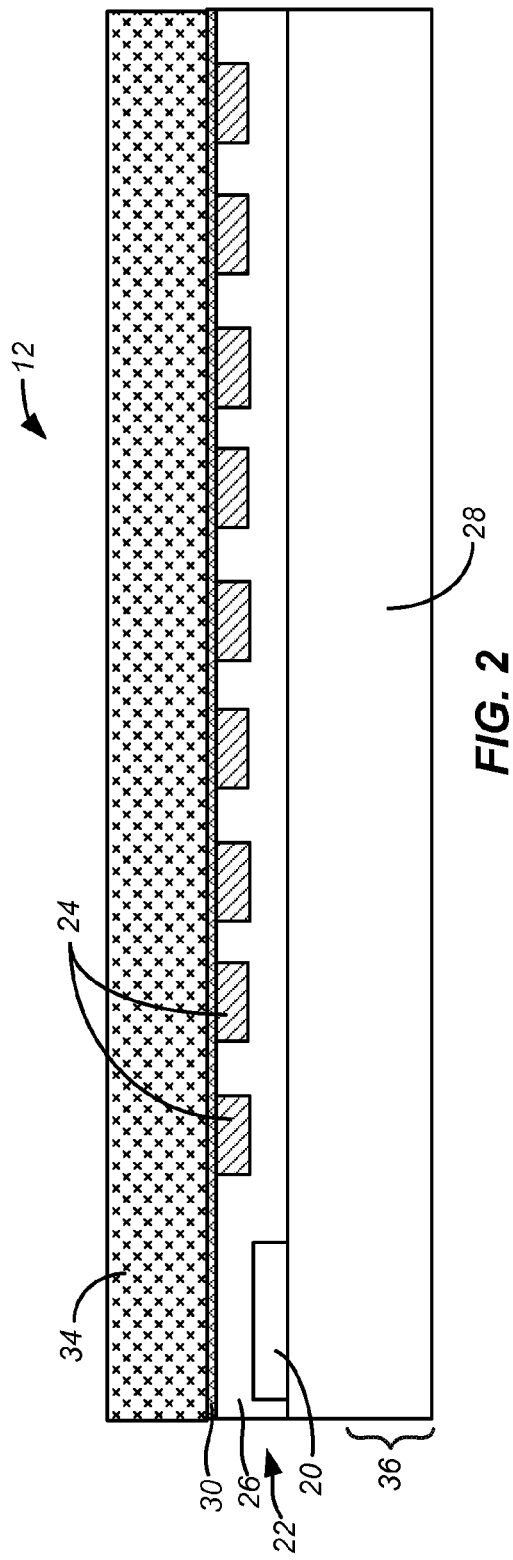
FIG. 1
FIG. 2

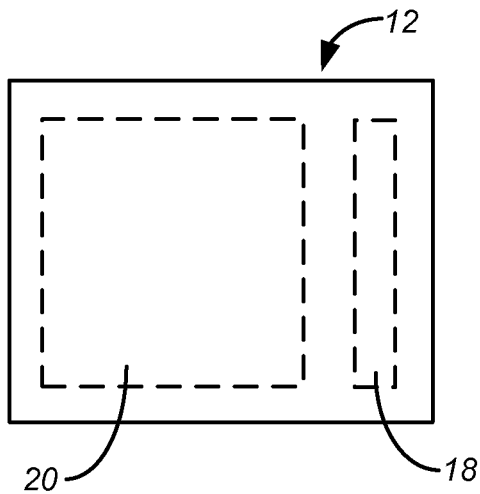
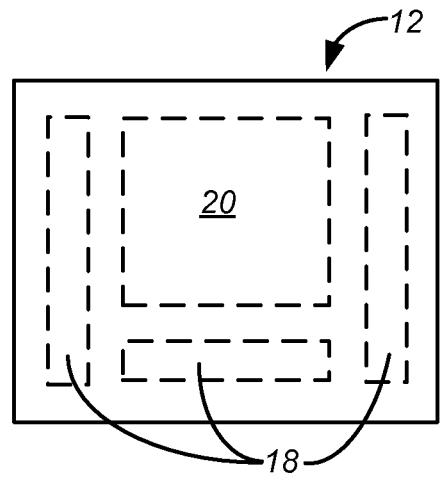
FIG. 19   FIG. 20
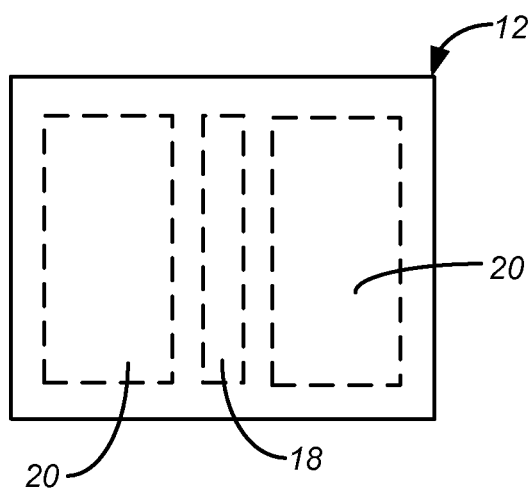
FIG. 21

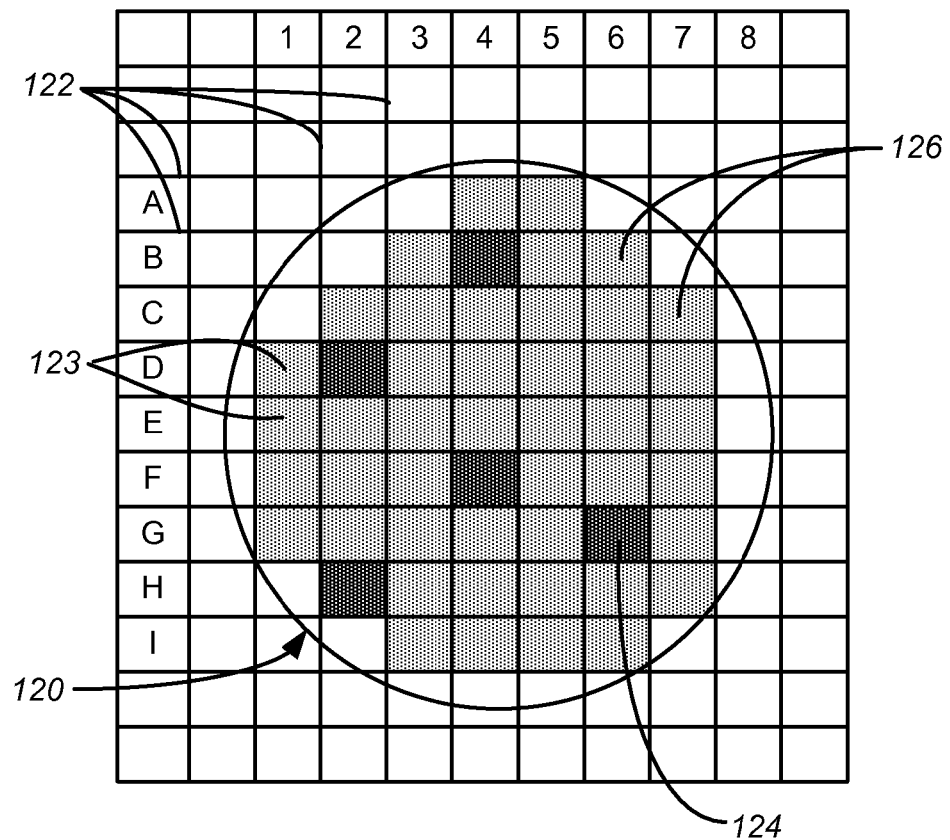
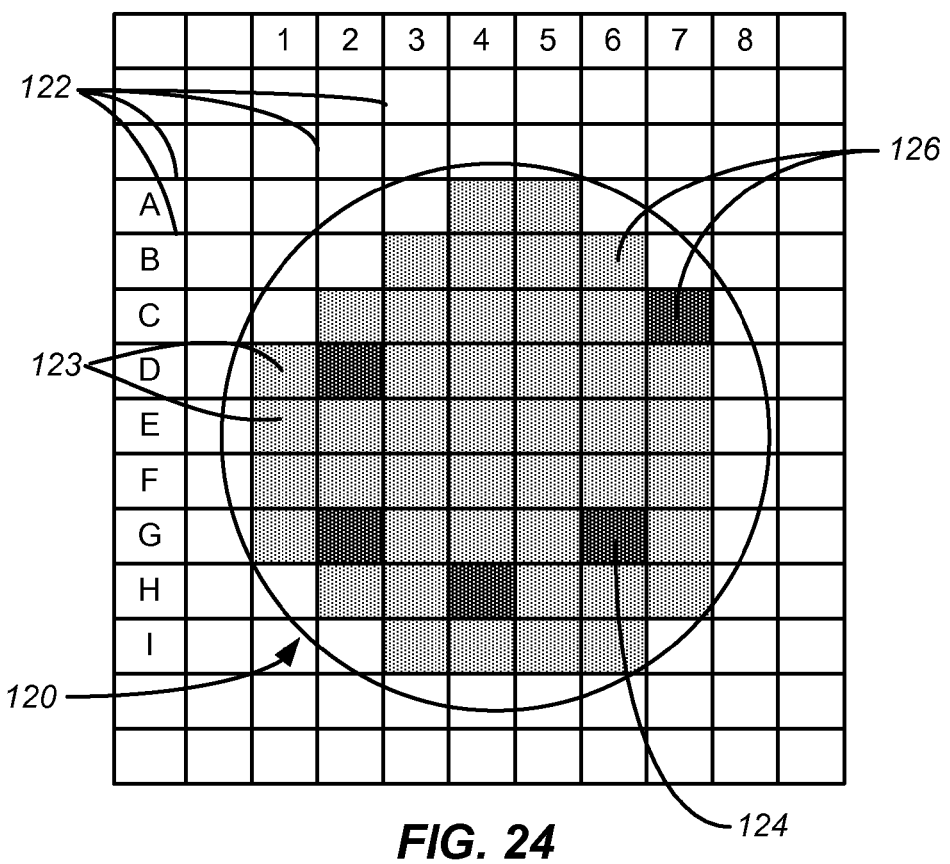
FIG. 24

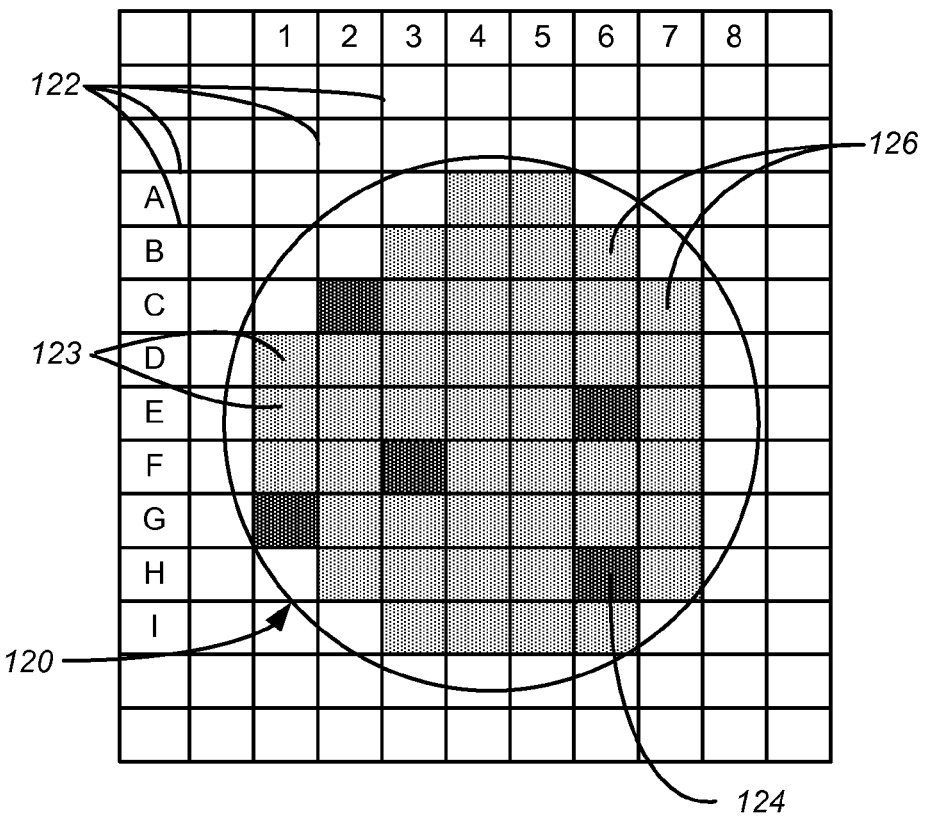
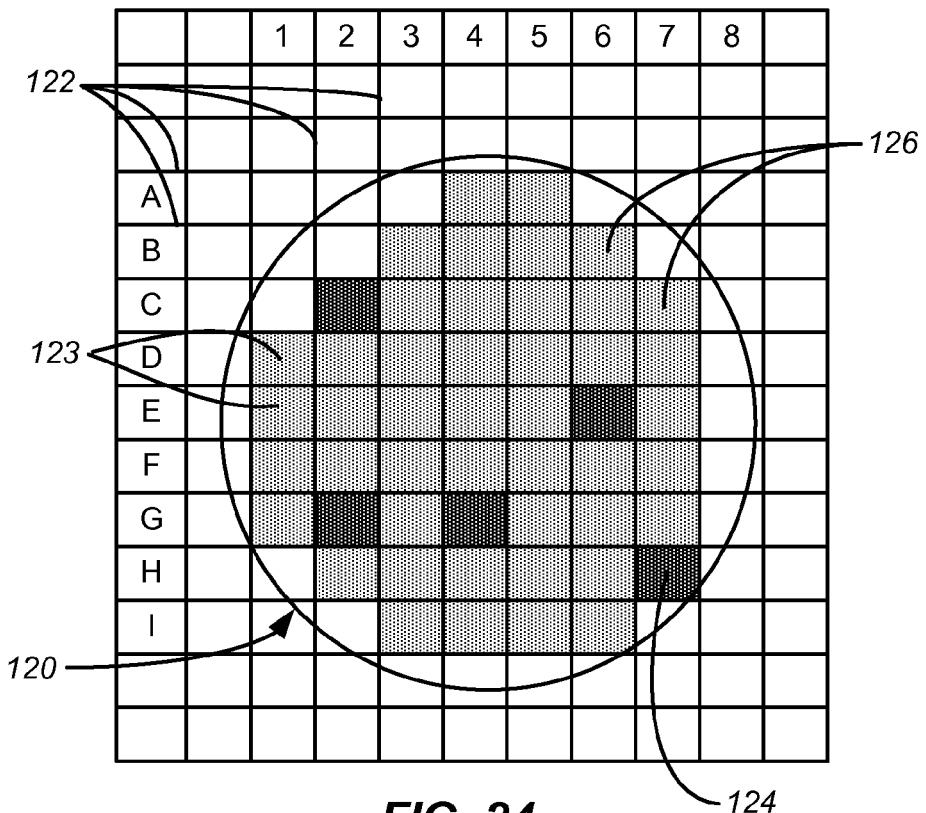
FIG. 24
(Continued)

METHOD FOR CREATING A 3D STACKED MULTICHIP MODULE

CROSS-REFERENCE TO RELATED APPLICATIONS

This application is a division of U.S. patent application Ser. No. 13/451,411, filed 19 Apr. 2012, entitled METHOD FOR CREATING A 3D STACKED MULTICHIP MODULE.

This application is related to the following U.S. patent applications: U.S. patent application Ser. No. 13/049,303, filed 16 Mar. 2011, entitled REDUCED NUMBER OF MASK FOR IC DEVICE WITH STACKED CONTACT LEVELS; and U.S. patent application Ser. No. 13/114,931, filed 24 May 2011, entitled MULTILAYER CONNECTION STRUCTURE AND MAKING METHOD.

BACKGROUND OF THE INVENTION

One type of three-dimensional integrated circuit (3D IC) is made using a number of semiconductor die stacked vertically and bonded to create the individual 3D ICs. Electrical connections from external bond pads to electrical conductors of the 3D ICs, and between electrical conductors of different layers of the 3D ICs, can be made using various methods. For example, in one wirebonding method the edges of adjacent chips can be staggered in a stair step fashion. This permits external bonding wires to be connected between pads on the chip and pads on a substrate.

Another method for making electrical connections between stacked chips, called through-silicon via (TSV), has generated significant interest. Interconnecting stacked chips by TSV has several advantages over conventional external wirebonding techniques. A stacked chip with TSV can exhibit a wider bandwidth and thus greater input/output compared to stacked chips connected via external wirebonding techniques. With TSV there is a shorter connection path which enhances speed and lowers power consumption.

TSV can be accomplished using wafer scale stacking with the aligned die separated or diced later. This provides for lower-cost, high throughput but it suffers from yield problems because the failure of one chip in a stack of chips causes that stack to fail resulting in lower yields. In addition, handling thinned down wafers is a manufacturing challenge that can result in damaged or destroyed product. TSV can also be accomplished using die scale stacking. This has the advantage that handling is relatively easy but at the expense of high cost.

Another disadvantage of conventional TSV is that a typical TSV process requires 11 steps for each die or wafer: TSV photoresist deposition, TSV etching, silicon dioxide deposition, barrier seed deposition, photoresist patterning, Cu/W deposition, photoresist removal, Cu/W chemical mechanical polishing, support/handling die bonding, die thinning, and bonding. In addition to the time and expense required for all the steps, the required handling and processing of each die results in lower yields.

BRIEF SUMMARY OF THE INVENTION

An example of a three-dimensional stacked multichip module comprises a stack of W integrated circuit die. Each die in the stack has a patterned conductor layer over a substrate. The patterned conductor layer includes an electrical contact region, the electrical contact region includes electrical conductors. At least one of the electrical conductors includes a landing pad. The stack of die comprises a first die at one end of the stack and a second die at the other end of the stack, the substrate of the first die faces the patterned conductor layer of the second die. The landing pads on each die are aligned with those on the other die in the stack. Electrical connectors extend from a surface of the stack of die and into the stack of die to electrically contact the landing pads to create a three-dimensional stacked multichip module having W die levels, W being an integer greater than 1. Other examples may also include one or more the following. The electrical connectors directly contact the landing pads. At least some of the die comprise device circuitry at a device circuitry location spaced apart from the electrical contact region. A material layer is over the patterned conductor layer of the first die. The electrical connectors pass through vertical vias in the electrical contact regions. Each electrical connector is electrically connected to one landing pad of one die level. The landing pads electrically contacted by the electrical connectors are arranged in a stair stepped arrangement.

An example of a three-dimensional stacked multi-wafer module includes a stack of integrated circuit wafers, each integrated circuit wafer comprising a grid of die regions. At least some of the die regions for each integrated circuit wafer are aligned with die regions of the other integrated circuit wafers of the stack of integrated circuit wafers. Each die region comprising a three-dimensional stacked multichip module described in the paragraph above.

An example of a first method for creating a three-dimensional stacked multichip module is carried out as follows. A set of W integrated circuit die are provided. Each die in the set includes a patterned conductor layer. The patterned conductor layer includes an electrical contact region, the electrical contact region comprising landing pads. A handling die is mounted to a selected die in the set. An exposed layer of the selected die is removed to create an enhanced handling die. The mounting and removing steps, using the enhanced handling die in each iteration, are repeated. This is carried out so that the landing pads on each die are aligned with those on the other die in the set, until all the die in the set are mounted, to create a three-dimensional stacked die. Connectors are formed from a surface of the module though the three-dimensional stacked die to contacts in the aligned landing pads in each die in the set. Doing so creates a three-dimensional stacked multichip module having W die levels.

Examples of the first method may also include one or more the following. The forming step is carried out with at least some of the die comprising device circuitry at a device circuitry location spaced apart from the electrical contact region. The mounting step further comprises depositing a dielectric, adhesion-enhancing layer between the handling die and the die. The die is selected so that it comprises a substrate having a first side, at which the patterned conductor region is located, and a second side opposite the first side, the exposed layer being removed from the second side of the substrate. At least a portion of the handling die is removed from the three-dimensional stacked multichip module to create an exposed surface. Contact openings are created in the surface, the contact openings overlying a landing pad of an electrical conductor for each die level; a set of N etch masks are selected with N being selected so that $2^{N-1}$ is less than W and $2^N$ is greater than or equal to W; the N masks are used to etch the contact openings to the W die levels, the N masks using step comprising etching $2^{n-1}$ die levels for effectively half of the contact openings for each mask $n=1, 2 \ldots N$; and whereby electrical conductors can be formed in the contact openings to contact the electrical conductor elements at each of the die levels. The surface is covered with a dielectric material following the handling die removing step; and the contact openings creating step includes removing at least a portion of the dielectric material. The N etch masks using step further comprises alternatingly covering and exposing 2n−1 landing pads for each mask n=1, 2 . . . N.

A second method for creating a plurality of three-dimensional stacked multichip modules is carried out as follows. A set of W integrated circuit wafers is provided. Each wafer in the set includes a grid of die regions. Each die region has an integrated circuit die comprising a patterned conductor layer, the patterned conductor layer including an electrical contact region. The electrical contact region has landing pads. A handling wafer is mounted to a selected wafer in the set, over the patterned conductor layers. An exposed layer of the selected wafer is removed to create an enhanced handling wafer. The mounting and removing steps are repeated using the enhanced handling wafer in each iteration, and so that the landing pads on each die are aligned with those on the other die in the set of integrated circuit wafers, until all the wafers in the set are mounted. This creates a three-dimensional stacked wafer comprising a grid of three-dimensional stacked die. Connectors from a surface of the three-dimensional stacked wafer to contacts in the aligned landing pads are formed to create a grid of three-dimensional stacked multi-chip modules. The grid of three-dimensional stacked multi-chip modules are physically separated into individual three-dimensional stacked multi-chip modules.

Examples of the second method may also be carried out with the connectors forming step carried out as follows. Contact openings are created through said surface of the three-dimensional stacked wafer, the contact openings overlying landing pads of electrical conductors for each die level of a plurality of the three-dimensional stacked multi-chip modules. A set of N etch masks is selected with N being selected so that $2^{N-1}$ is less than W and $2^N$ is greater than or equal to W. The N masks are used to etch the contact openings to the W die levels by etching $2^{n-1}$ die levels for effectively half of the contact openings for each mask n=1, 2 . . . N. Electrical conductors can be formed in the contact openings to electrically contact landing pads at each of the die levels. Examples of the second method may also be carried out so that the N etch masks using step further comprises alternatingly covering and exposing $2^{n-1}$ landing pads for each mask n=1, 2 . . . N.

Other features, aspects and advantages of the present invention can be seen on review the figures, the detailed description, and the claims which follow.

BRIEF DESCRIPTION OF THE DRAWINGS

FIG. 1 is a simplified enlarged cross-sectional view of a portion of a die suitable for creating a 3D stacked multichip module illustrating the electrical contact region and device circuitry both within a patterned conductor layer, the device circuitry shown schematically and at a reduced scale, the device circuitry spaced apart from the electrical contact region.

FIG. 2 shows the structure of FIG. 1 after a handling die has been mounted to the patterned conductor layer of the die of FIG. 1.

FIG. 9 shows the structure of FIG. 8 after creating openings in the dielectric material aligned with the ground conductor and electrical conductor locations.

FIG. 10 illustrates the result of using a first photoresist mask and etching through one layer.

FIG. 11 illustrates results of using a second photoresist mask and etching through two layers.

FIG. 12 shows a third photoresist mask and results of etching through four layers creating vias extending down to each level.

In FIG. 13 the third photoresist mask has been removed followed by etching of the vias.

FIG. 14 shows result of lining the etched vias with a dielectric material.

FIG. 15 illustrates a fourth photoresist mask covering the lined etched vias of FIG. 14 but exposing a ground conductor location and the result of etching through the levels down to the lowest conductor level.

FIG. 16 shows result of an isotropic etching of substrate layers followed by the removal of the fourth photoresist mask.

FIG. 17 illustrate an electrically insulating material deposited into the recessed regions formed in the step of FIG. 16 followed by etching back of the exposed dielectric material to create an enlarged ground conductor via.

FIG. 18 shows the structure of FIG. 17 after filling the vias with a suitable electrical conductor to create a three-dimensional stacked IC assembly together with contact pads and a handling die on top of the stacked IC assembly.

FIGS. 19, 20 and 21 are simplified plan views of three examples of a die including one or more electrical contact regions and one or more regions with device circuitry.

FIG. 24 illustrates an example in which four different wafers each having 90% good die and 10% bad die.

DETAILED DESCRIPTION OF THE INVENTION

Figure 3:
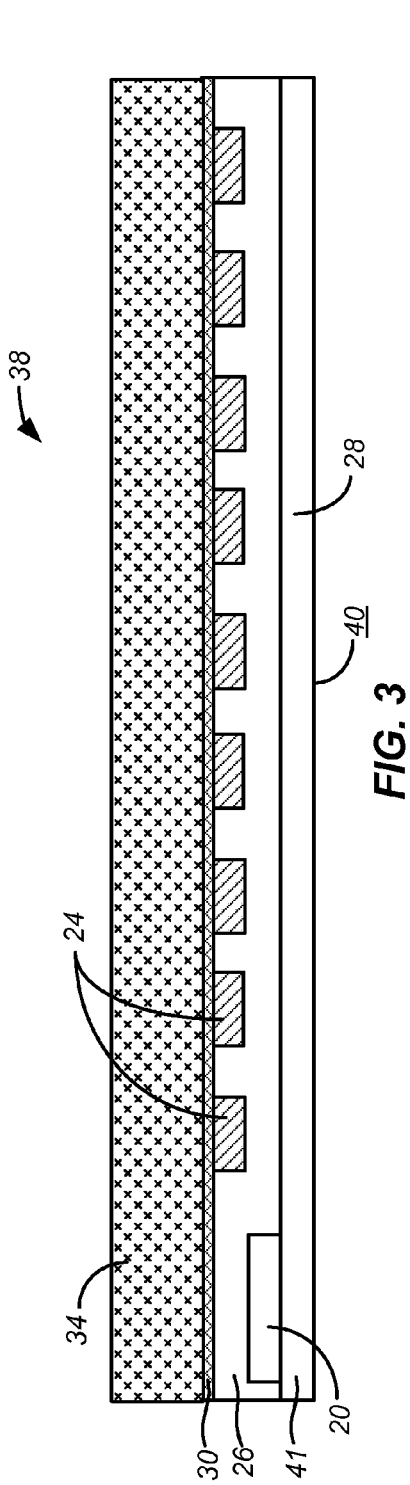
FIG. 3 shows the structure of FIG. 2 after a lower portion of the substrate of the die of FIG. 2 has been removed to create an enhanced handling die.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

The present invention can be carried out using wafer scale stacking or die scale stacking. In FIGS. 1-21, the invention will generally be described in terms of die scale stacking. The additional advantages which accrue from carrying out the invention using wafer scale stacking are described in the description of the present invention with respect to FIGS. 22-25. Like reference numerals will be typically used when referring to like elements of dies and wafers.

FIG. 1 is a simplified enlarged cross-sectional view of an IC die 12 suitable for creating a 3D stacked multichip module as discussed below. Die 12 of FIG. 1 illustrates an electrical contact region 18 and schematically illustrates active device circuitry 20 for die 12, both within a patterned conductor layer 22. Patterned conductor layer 22 includes a dielectric layer 26 overlying and supported by a substrate 28 of die 12. Substrate 28 is typically silicon. Electrical contact region 18 includes a number of electrical conductors 24, typically made of a suitable metal such as copper or tungsten. Dielectric layer 26 is typically an oxide such as $SiO_2$. Electrical conductors 24 and device circuitry 20 are, in this example, formed in dielectric layer 26 and are spaced apart from one another by the material of dielectric layer 26. The active device circuitry 20, which includes circuits for the mission function of the die, is preferably spaced apart from the electrical contact region 18 and thus does not underlie electrical contact region 18. The active device circuitry 20 can comprise a flash memory circuit, another type memory circuit, an application specific circuit, a general purpose processor, a programmable logic device, combinations of circuit types as in a system of a chip device, and combinations of these and other types of circuits. In FIG. 1, active device circuitry 20 is illustrated as a relatively small element only for the purpose of the drawing. The relative size compared to the contact region 18 depends on the particular implementation.

FIG. 2 shows the die 12 of FIG. 1 after a hard mask layer 30 has been deposited on the upper surface 32 of patterned conductor layer 22 of FIG. 1. Hard mask layer 30 is an optional dielectric layer used for isolation and enhanced adhesion. A handling die 34 is mounted to hard mask layer 30 of die 12. Handling die 34 is preferably sufficiently thick and strong to help prevent damage to the underlying die 12, and subsequently added die 12, during the subsequent processing steps. Handling die 34 is typically a bare Si die. When wafer scale stacking is used, a handling wafer is mounted to wafer 12.1, typically on a hard mask layer corresponding to hard mask layer 30 applied to wafer 12.1. The handling wafer is preferably sufficiently thick and strong to help prevent damage to the underlying wafer 12.1, and subsequently added wafers 12.1, during the subsequent processing steps. The handling wafer is typically a bare Si wafer.

FIG. 3 shows the structure of FIG. 2 after a lower portion 36, see FIG. 2, of the substrate 28 of the die 12 of FIG. 2 has been removed to create an enhanced handling die 38 having a lower, bonding surface 40 on the remaining substrate 41. This die thinning step can be undertaken because of the strength provided to the underlying die 12 by handling die 34. During wafer scale operations, these operations would result in creation of an enhanced handling wafer corresponding to enhanced handling die 38.

Figure 4:
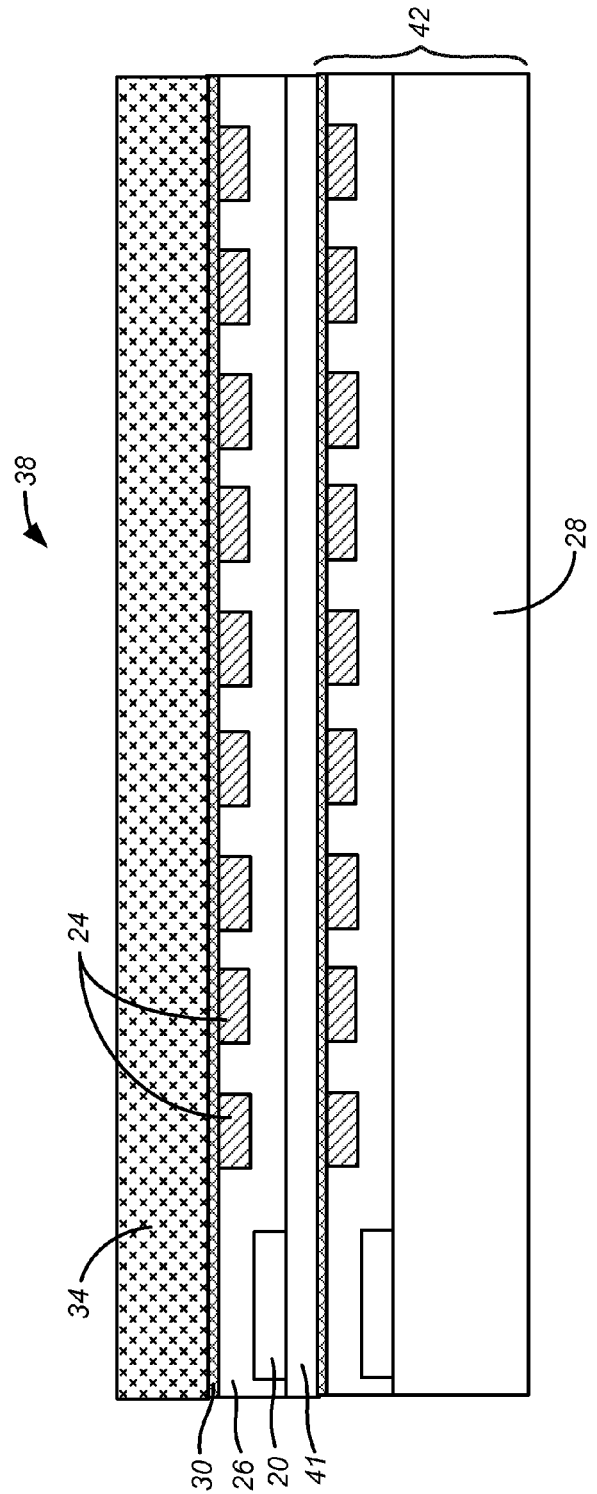
FIG. 4 shows the structure of FIG. 3 after the structure of FIG. 3 has been mounted on top of a further die, the further die being similar to the die of FIG. 1.

FIG. 4 shows the enhanced handling die 38 of FIG. 3 mounted on top of a further die 42. Further die 42 is similar to the die 12 of FIG. 1 but preferably includes hard mask layer 30 formed on upper surface 32 of patterned conductor layer 22. Lower surface 40 of enhanced handling die 38 is mounted to hard mask layer 30 of further die 42. Similarly, during wafer scale operations, the lower surface of the enhanced handling wafer is mounted to the hard mask layer of the further wafer.

Figure 5:
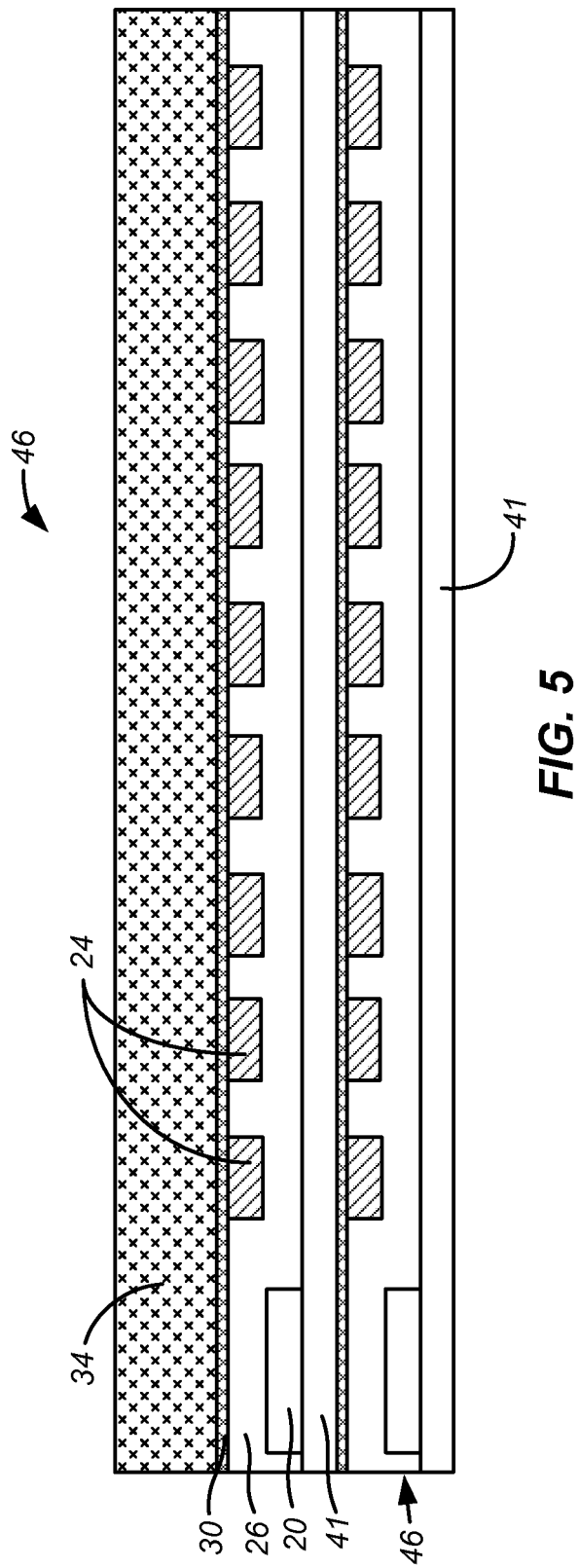
FIG. 5 shows the structure of FIG. 4 after a lower portion of the substrate of the die has been removed to create a stacked die.
Figure 6:
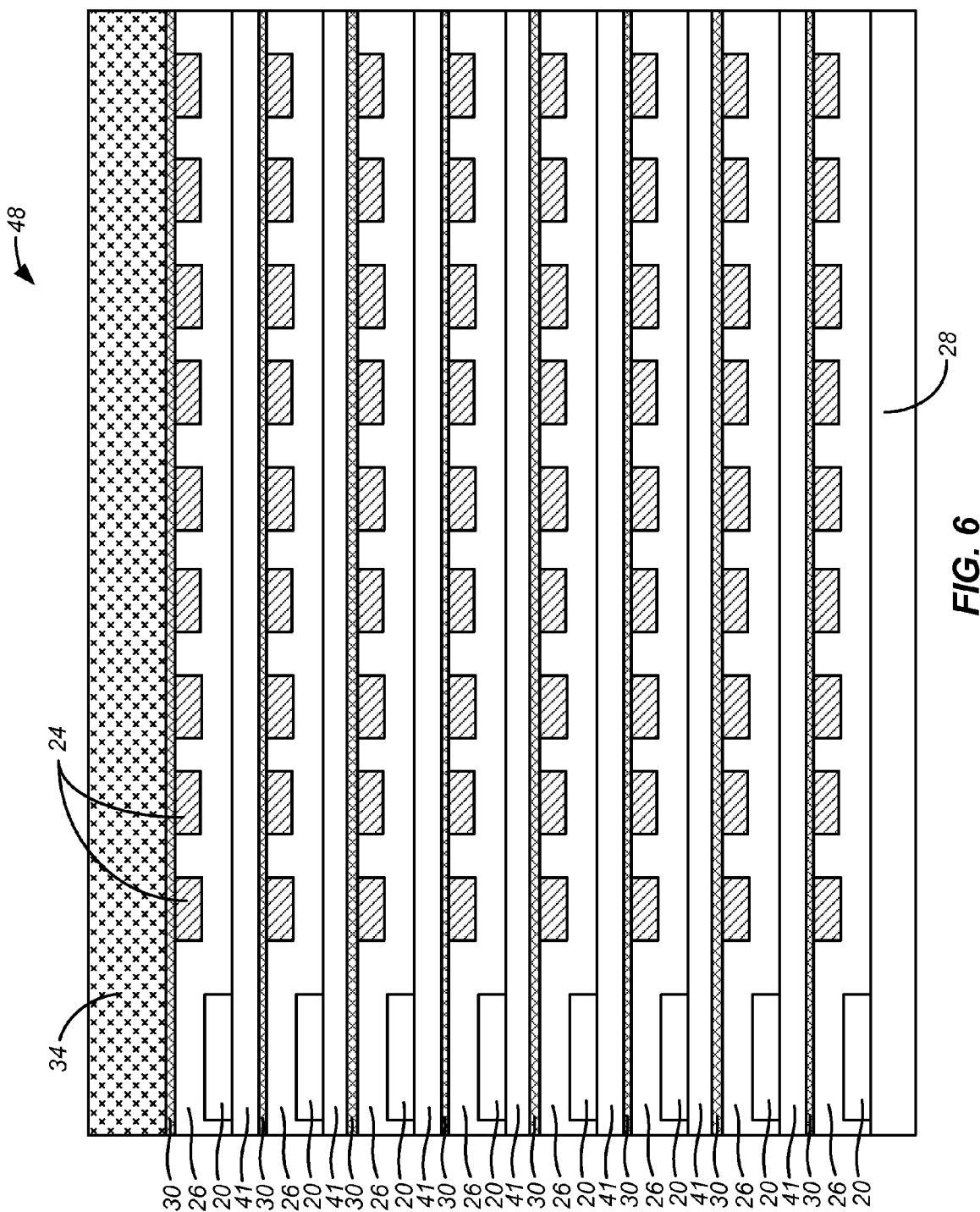
FIG. 6 shows the results of repeating the processing steps of FIGS. 4 and 5 creating a first 3D stacked die.

FIG. 5 shows the structure of FIG. 4 after the lower portion 36, see FIG. 4, of the substrate 41 of each of the die 12 has been removed to create a stacked die 46. FIG. 6 shows the results of repeating the processing steps of FIGS. 4 and 5 using additional further die 42 to create a first 3D stacked die 48. One advantage resulting from reducing the thickness of stacked die 46 is that the depth of the via that must be etched and then filled, see FIGS. 9-18, is reduced. This simplifies manufacturing because increasing the depth of the via often requires increasing the diameter of the via. In practice, the vias may be tapered and the technology for filling the vias become limiting with large aspect ratios (depth divided by the width of the via). During wafer scale operations, a stacked wafer is created in a similar manner followed by creation of a first 3-D stacked wafer.

Figure 7:
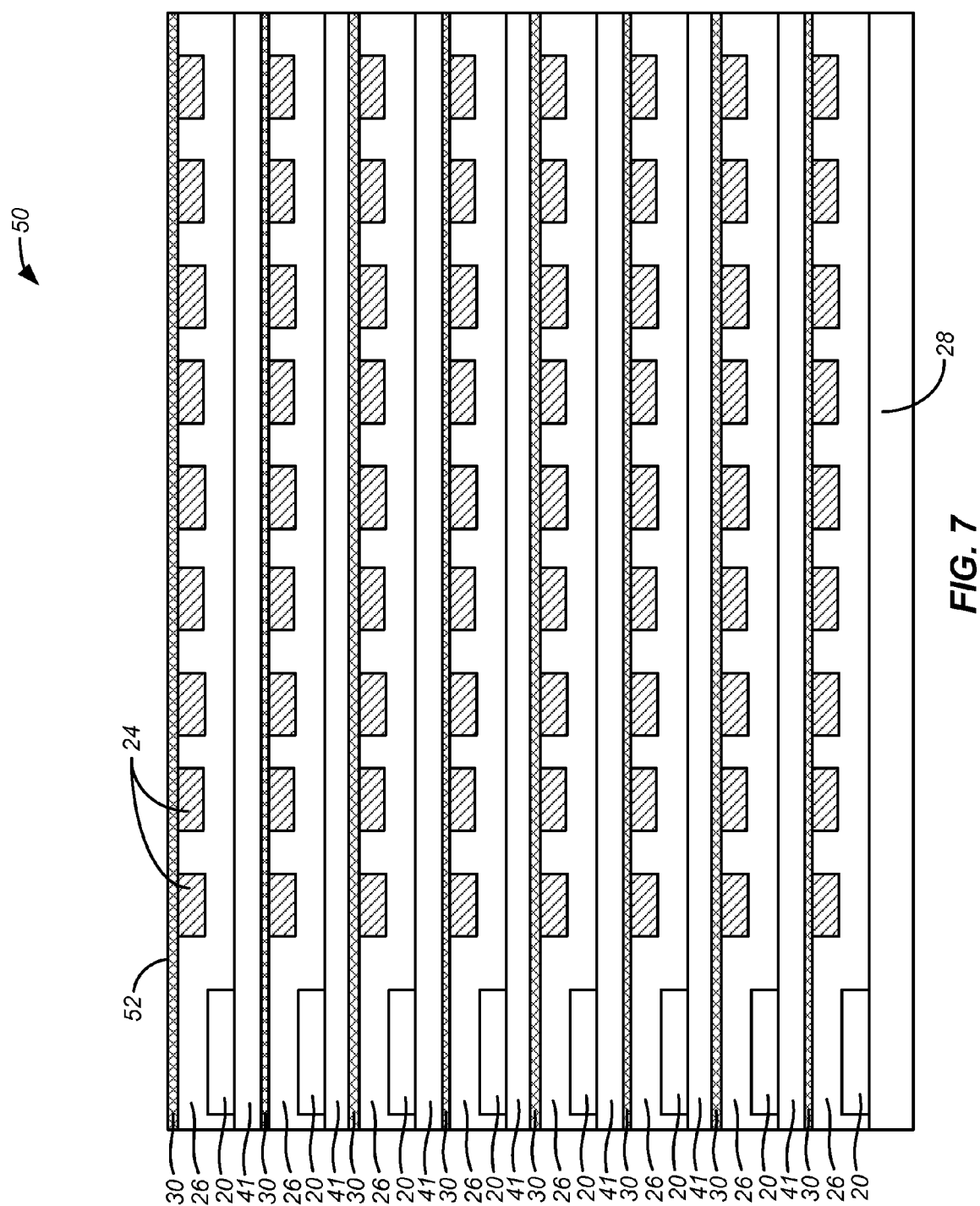
FIG. 7 shows the structure of FIG. 6 after the removal of at least a portion of the handling die of FIG. 6 creating a second 3D stacked die including an exposed surface.
Figure 8:
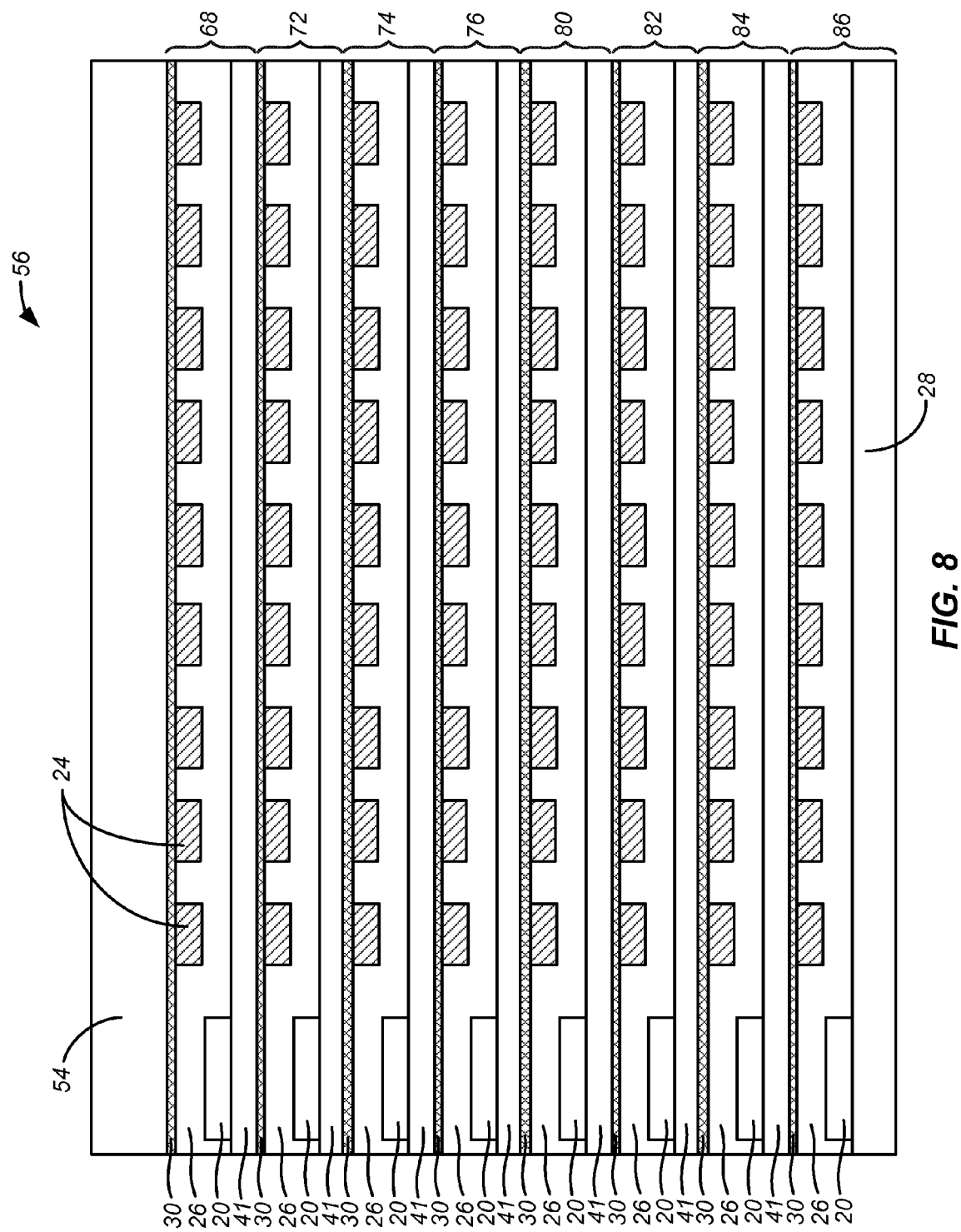
FIG. 8 shows the structure of FIG. 7 after a dielectric material has been deposited on the exposed surface to create a third 3D stacked die.
Figure 25:
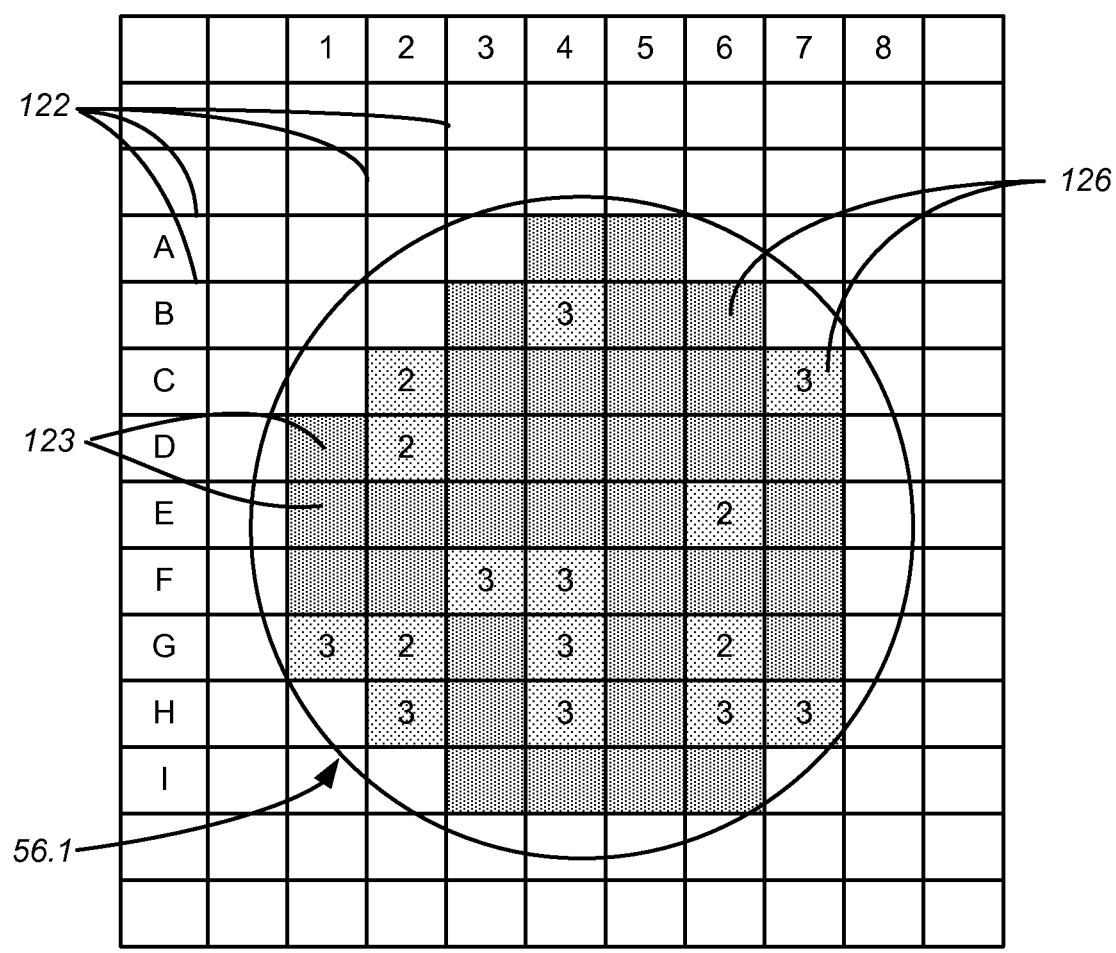
FIG. 25 illustrates results of stacking the four wafers of FIG. 24 with an indication of the number of good die within each die region having at least one bad die.

FIG. 7 shows the first 3D stacked die 48 of FIG. 6 after the removal of at least a portion of the handling die 34 of FIG. 6 creating a second 3D stacked die 50 with an exposed surface 52. FIG. 8 shows the structure of FIG. 7 after a dielectric material 54 has been deposited on the exposed surface 52 to create a third 3D stacked die 56. Likewise, during wafer scale operations, the second 3-D stacked wafer and the third 3-D stacked wafer 56.1, see FIG. 25, are created. FIGS. 9-18 illustrate a sequence of steps creating electrical connectors 60, shown as a part of stacked multichip module 61 in FIG. 18, in contact with electrical conductors 24. Electrical connectors 60 connect the landing pads 98 of electrical conductors 24 at the different levels to contact pads 62. The different electrical connectors 60 are identified in FIG. 18 as electrical connectors 60.0 through 60.7 with the left most being 60.0. The locations for the electrical connectors 60 for contact with the corresponding electrical conductors 24 are labeled 0 through 7 in the figures. The position labeled GC identifies the location of ground connector 64 which typically electrically contacts electrical conductors 24 at each level. While only one electrical connector 60 is shown to contact an electrical conductor 24 at each level, in practice, many different electrical connectors 60 would be used to contact electrical conductors 24 at the same level. During wafer scale operations, the same basic processing steps are used on a third 3-D stacked wafer 56.1 to create an array of stacked multichip modules 61.

Figure 9:
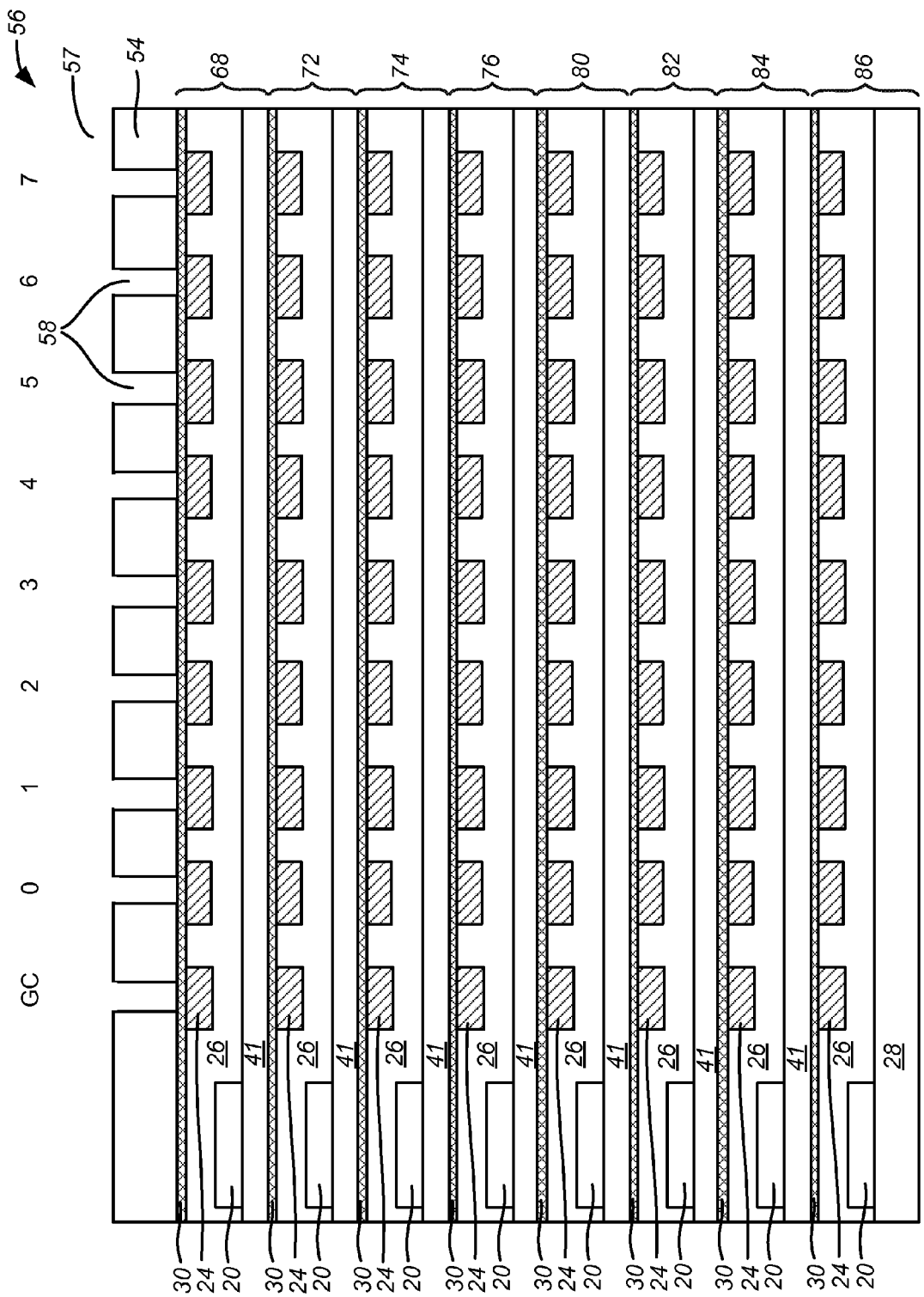
FIGS. 9-18 show a sequence of steps used to create vertically oriented electrical connectors in contact with the horizontally oriented electrical conductors at the different levels.

FIG. 9 shows the structure of FIG. 8 after creating an initial-processing photoresist mask 57 on dielectric material 54 followed by etching through dielectric material 54 down to hard mask layer 30. This creates openings 58 aligned with ground conductor location GC and electrical conductor locations 0-7.

Figure 10:
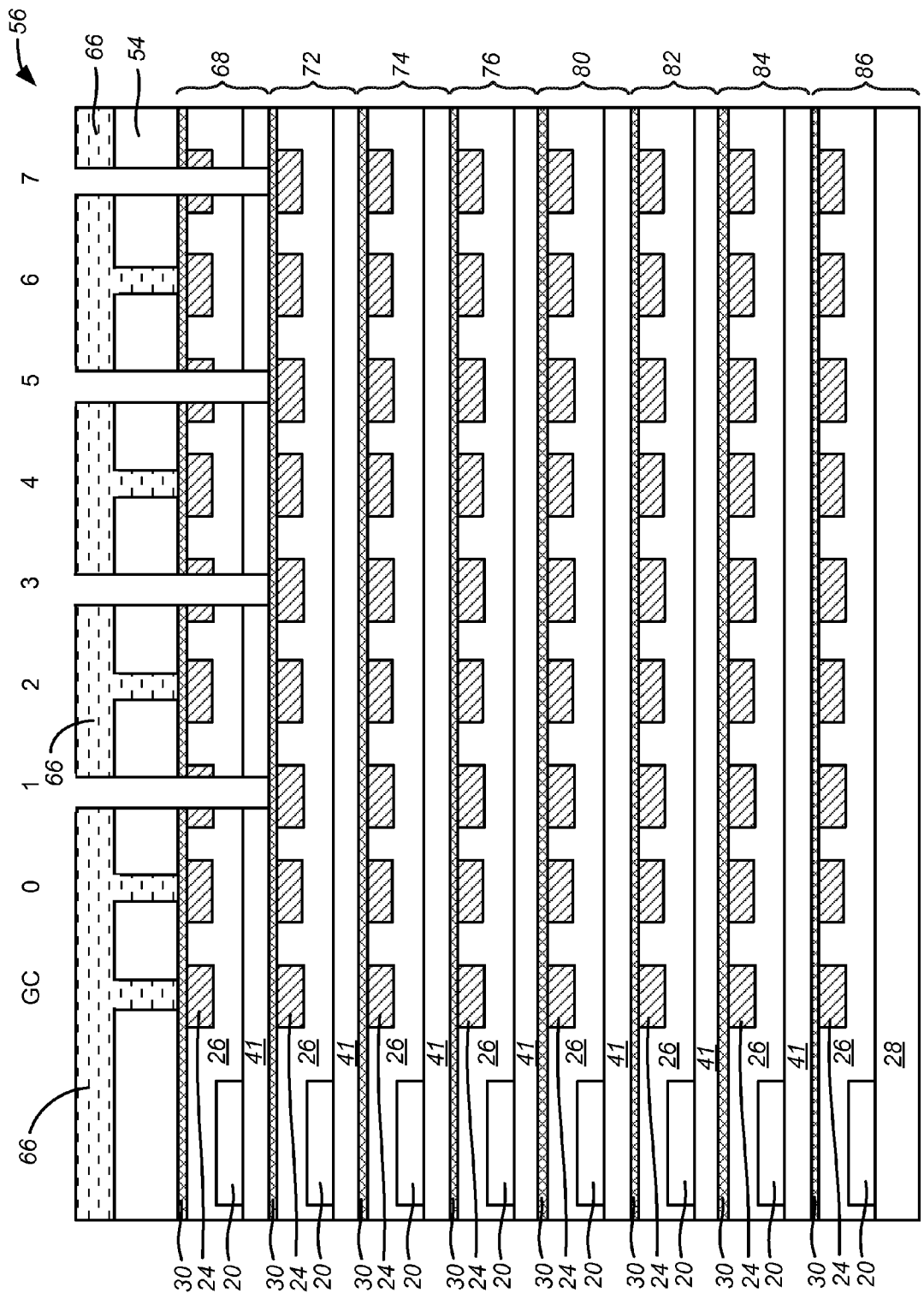

A first photoresist mask 66, shown in FIG. 10, is created on the structure of FIG. 9 except for openings 58 at electrical conductor locations 1, 3, 5 and 7. These openings, which are aligned with the electrical conductors 24, are then etched one level through hard mask layer 30, electrical conductors 24 at the first, topmost levels 68, dielectric layer 26 and the silicon substrate 41 stopping just above electrical conductors 24 at the second level 70. While electrical connectors 60 are shown in the figures to be aligned in a row, other layouts are possible. For example, electrical connectors 60 could be arranged in a number of parallel or transversely extending rows. For example, electrical contact region 18 of FIG. 1 could include two or more rows of electrical connectors 60.

Figure 11:
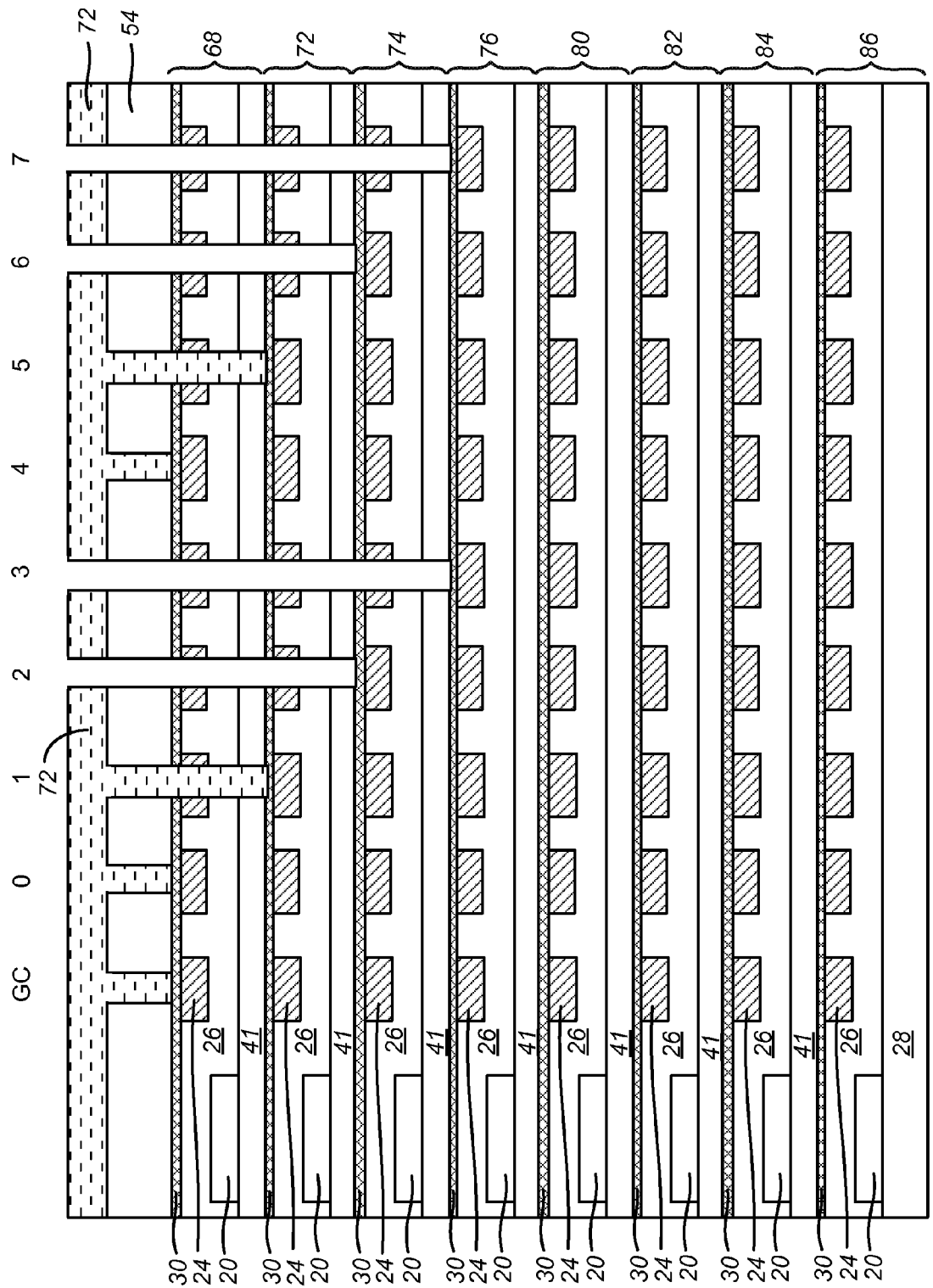

Next, as shown in FIG. 11, first photoresist mask 66 is removed and then a second photoresist mask 72 is formed on the resulting structure of FIG. 10 to cover ground conductor locations GC, electrical conductor locations 0, 1, 4, 5, and following location 7. The etching of two levels proceeds as follows. The portions of the resulting structure underlying locations 2 and 6 are etched two levels through first and second levels 68, 70 down to the electrical conductors 24 at those levels. The portions of the resulting structure underlying locations 3 and 7 are etched two levels through second and third levels 70, 74 down to the electrical conductors 24 at those levels. Doing so creates the structure shown in FIG. 11.

Next, second photoresist mask 72 is removed and a third photoresist mask 78 is formed to cover ground conductor location GC, electrical conductor locations 0, 1, 2, 3, and following location 7. The exposed portions of the structure overlying locations 4, 5, 6 and 7 are then etched four levels, that is down to fifth level 80, sixth level 82, seventh level 84 and eighth level 86 at locations 4, 5, 6 and 7, respectively, to create vias 77 in the structure of FIG. 12.

Third photoresist mask 78 is then removed followed by an isotropic etch of the exposed portions of substrates 41 at vias 77 to create recessed regions 88. See FIG. 13. An isotropic etch of electrical conductors 24 at vias 77 is then conducted to create conductor recessed regions 90 along the vias 77. These etching steps create modified vias 92.

Figure 14:
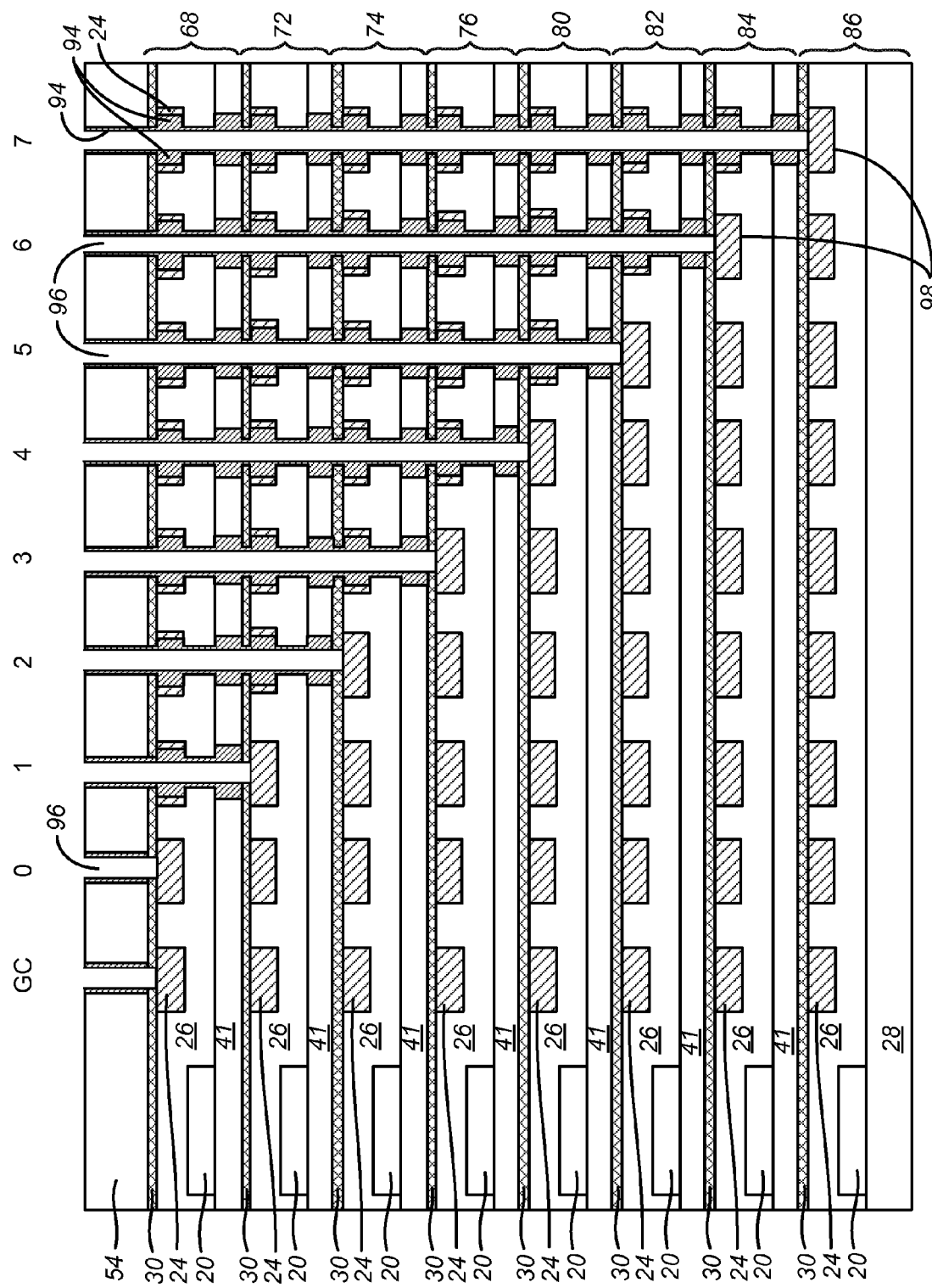

FIG. 14 shows the results of lining modified vias 92 with a dielectric material 94, such as an oxide material 94, thus filling in recessed regions 88, 90 with the oxide material 94. Oxide material 94 could be, for example, SiN. The resulting vias 96 are extended to open onto the portions of the underlying electrical conductors 24 acting as landing pads 98.

Figure 15:
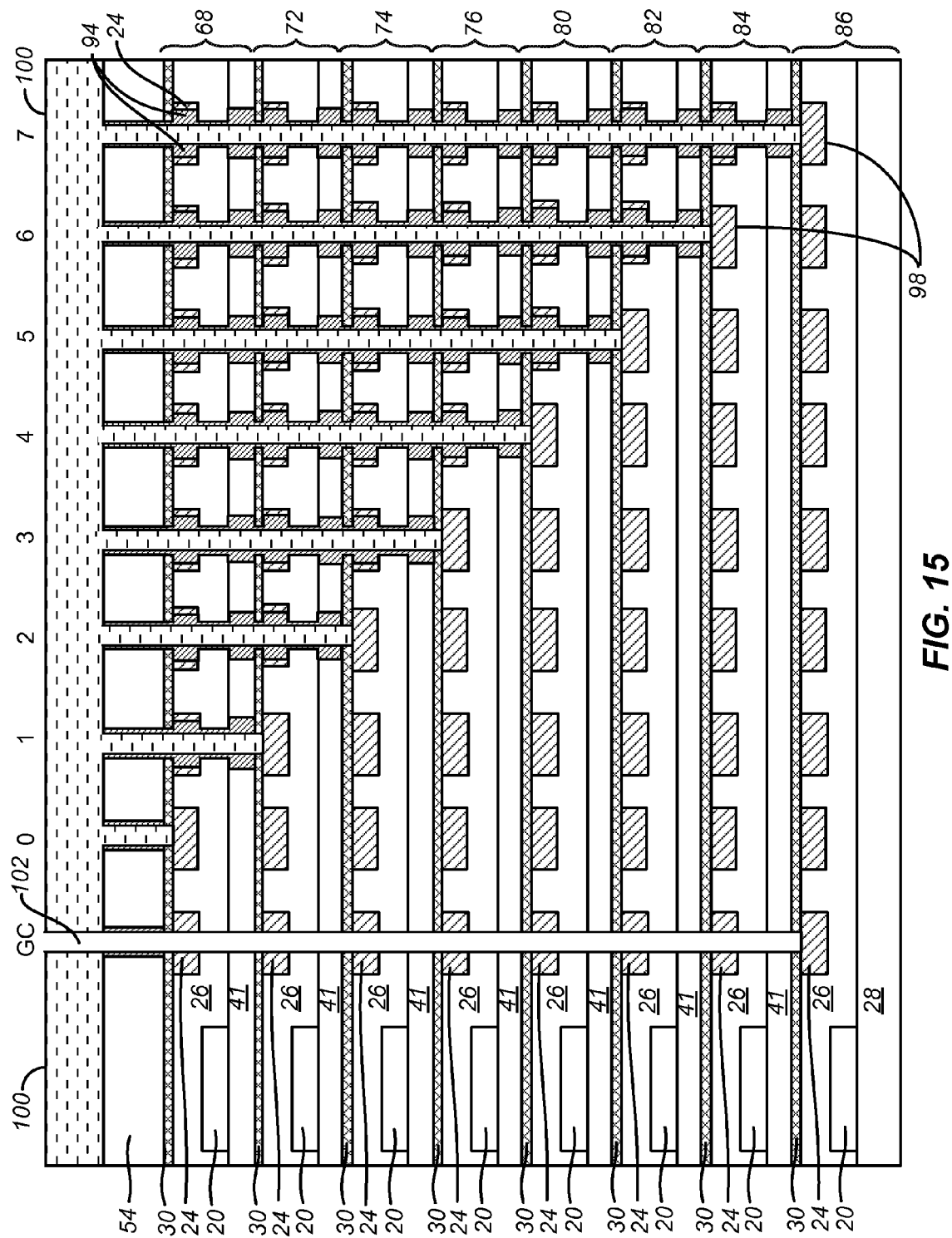
Figure 16:
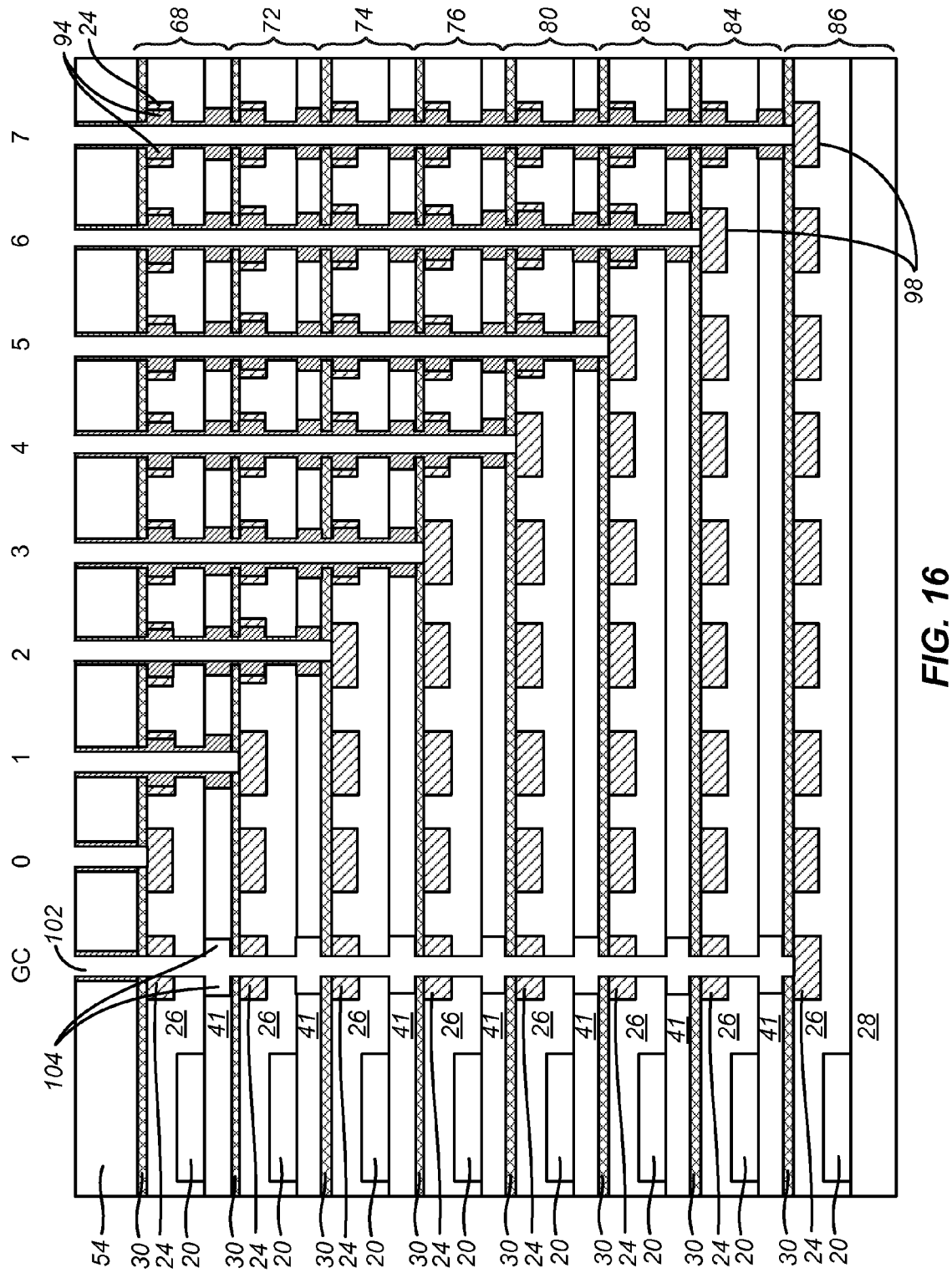
Figure 17:
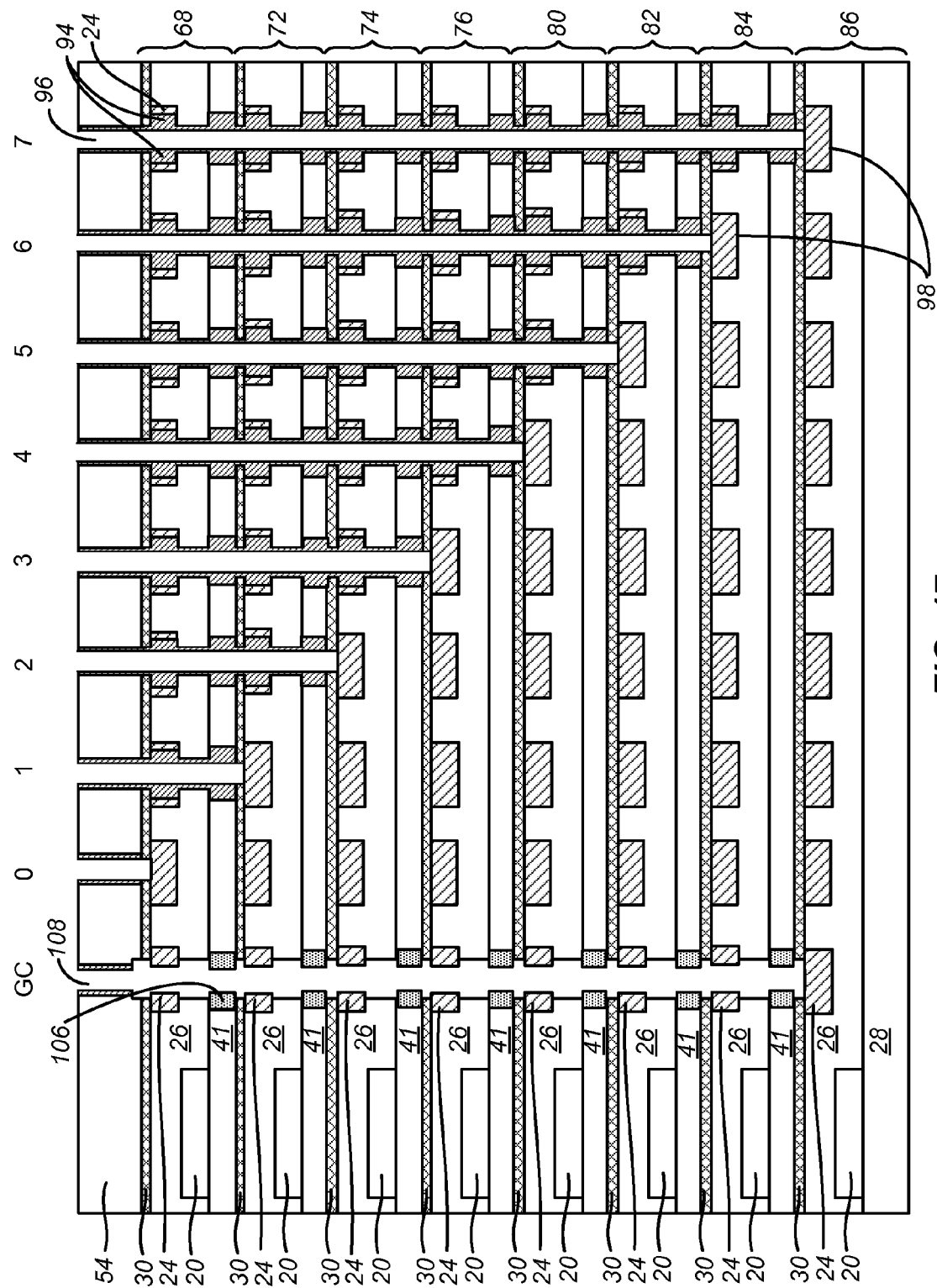
Figure 18:
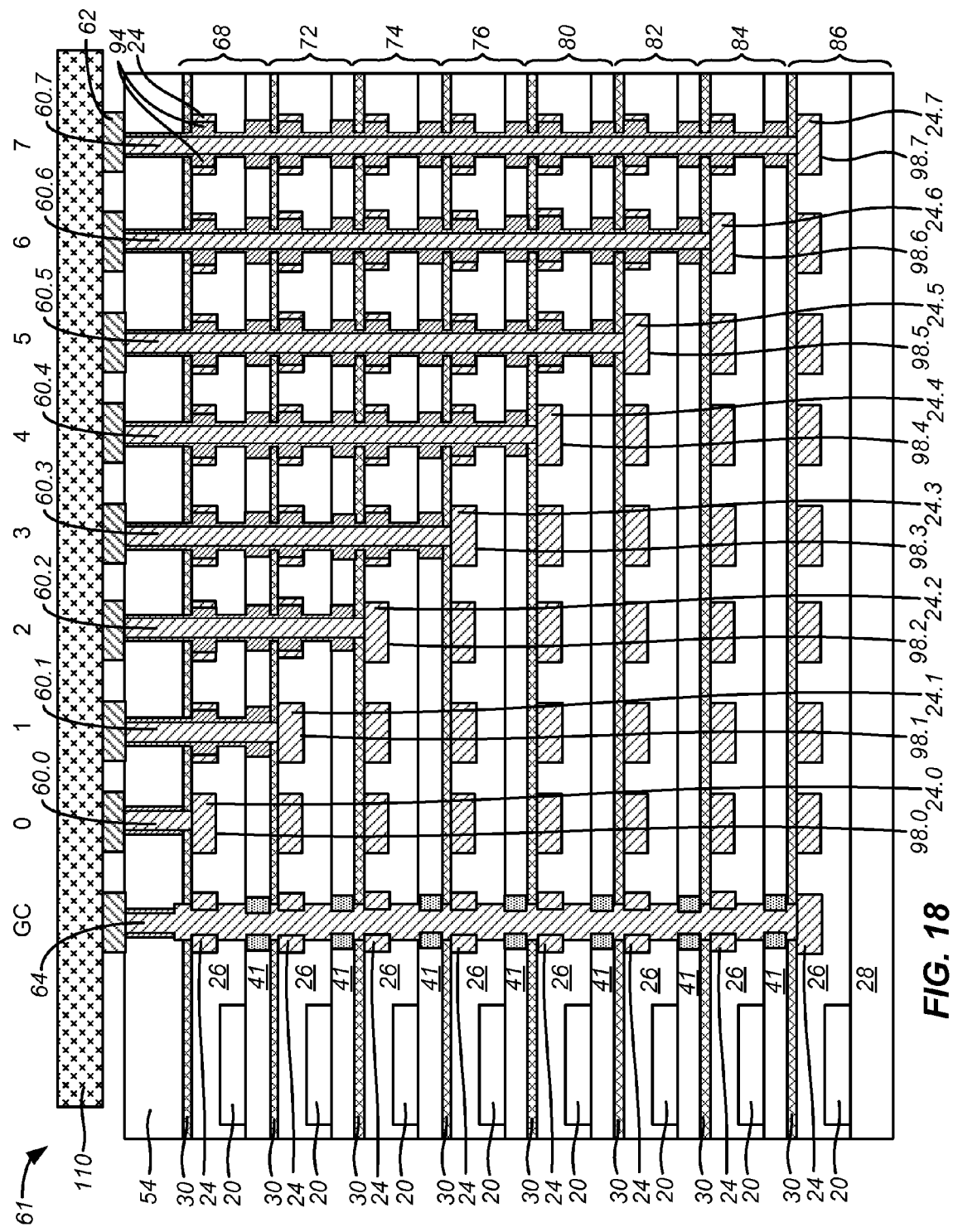

FIGS. 15-17 show processing steps used to form the electrical conductors 60 and ground conductor 64 shown in FIG. 18. In FIG. 15, a fourth photoresist mask 100 is shown covering everything except for ground conductor location GC. FIG. 15 also shows the result of etching through first through seventh levels 68, 70, 74, 76, 80, 82, 84 and down to electrical conductor 24 at eighth level 86 creating a ground conductor via 102. FIG. 16 shows result of an isotropic etching of substrates 41 at ground conductor via 102 to create recessed regions 104 opening onto ground conductor via 102. This is followed by the removal of fourth photoresist mask 100.

FIG. 17 illustrates the result of depositing an electrically insulating material 106, such as an organic material, for example a polymer, within recessed regions 104. In addition, the exposed dielectric material at layers 26 is etched back to create an enlarged ground conductor via 108. This causes an increase in the exposed sidewall contact surfaces of the electrical conductors 24 through which enlarged ground conductor via 108 passes.

FIG. 18 illustrates the structure of FIG. 17 following filling resulting vias 96 and enlarged ground conductor via 108 with a metal or other suitable electrical conductor to create ground connector 64 and electrical connectors 60.0-60.7. Doing so also creates three-dimensional stacked multichip module 61. Multichip module 61 is shown with contact pads 62 captured between multichip module 61 and a structure 110. The structure 110 could be, for example, a handling die or a die with active components, such as memory elements or logic devices, or a combination thereof, due to the flexibility provided by the technology. When structure 110 includes active components, structure 110 could be interconnected with stacked multichip module 61 through electrical connections to contact pads 62 and thus electrical connectors 60. Ground conductor 64 and electrical connectors 60 are lengths of substantially homogeneous electrically conductive material. By substantially homogeneous, it is meant herein that the conductors 60 lack physical boundaries between the levels. The conductors 60 are substantially homogeneous as used herein even if the conductive material used to form them includes multiple layers of different materials deposited in the vias, which may vary in relative concentration in each level as a result of the manufacturing process. This is in contrast to the electrical connectors formed by conventional TSV processes in which the electrical connectors within the individual via of each layer are separately formed and then are electrically connected to one another when the chips or wafers are stacked and bonded to one another, forming seams often with a separate conductive material joining the opposed electrode conductors.

While the die 12 used to form first 3D stacked die 48 of FIG. 6 could have electrical conductors 24 at different positions and patterns on the individual die, it may be preferred that the positions and patterns for electrical conductors for each die 12 be the same to facilitate manufacturing processes. In particular, it is typically desired that landing pads 98 at each level be aligned.

Figure 12:
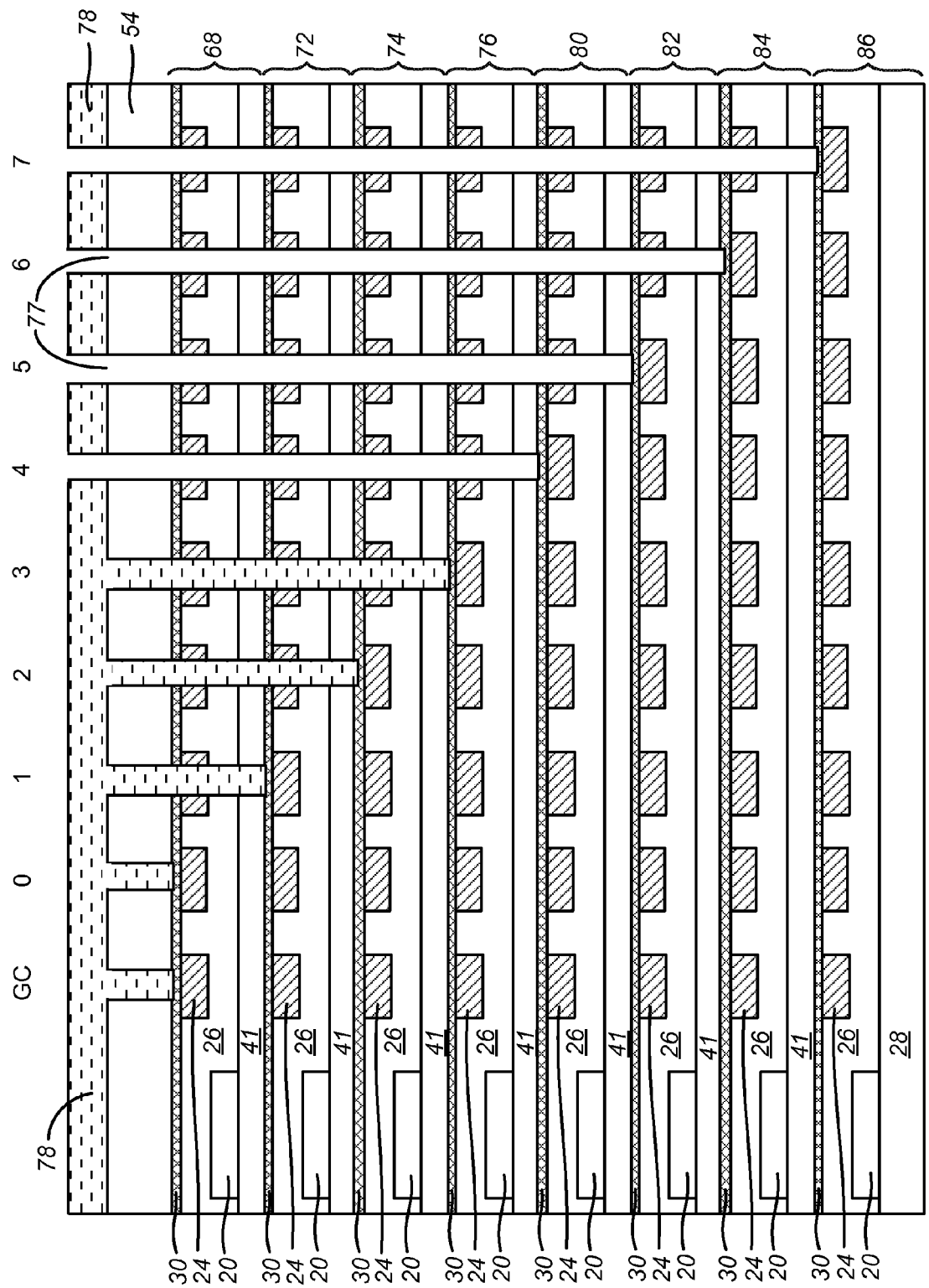
Figure 13:
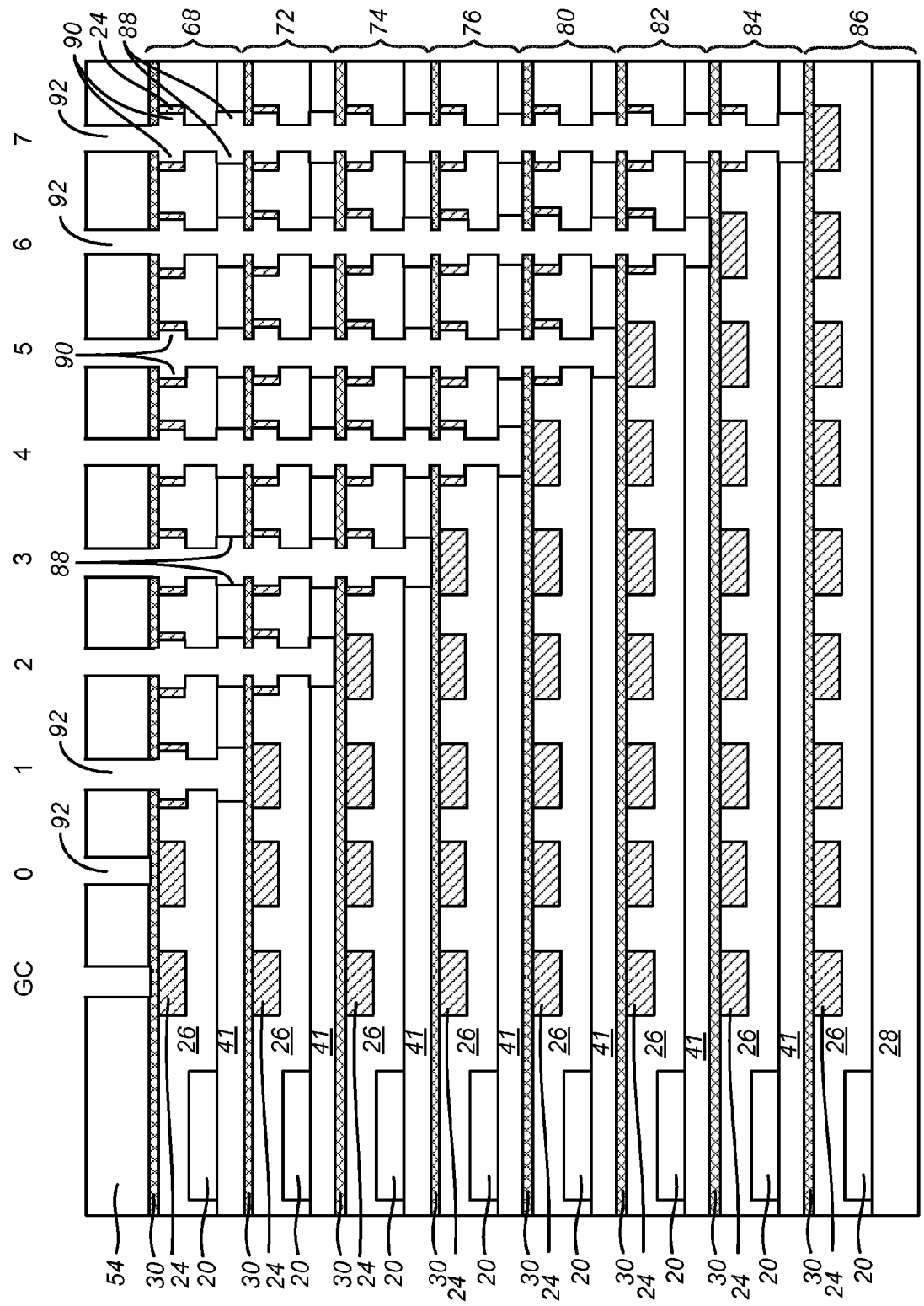

The above-described process for creating electrical connectors 60 can be referred to as a binary process, based on $2^0 \ldots 2^{n-1}$ with n being the number of etching steps. That is, first photoresist mask 66, see FIG. 10, alternatingly covers $2^0$ landing pads 98 and exposes $2^0$ landing pads 98; second photoresist mask 72, see FIG. 11, alternatingly covers $2^1$ landing pads 98 and exposes $2^1$ landing pads 98; third photoresist mask 78, see FIG. 12, alternatingly covers $2^2$ landing pads 98 and exposes $2^2$ landing pads 98; and so on. Using this binary process, n masks can be used to provide access to $2^n$ landing pads 98 for $2^n$ electrical conductors 24 at $2^n$ levels. Thus, using 3 masks provides access to 8 landing pads 98 for 8 electrical conductors 24 at 8 levels. Using 5 masks would provide access to 32 landing pads 98 for 32 electrical conductors 24. The order of etching need not be in the order of n−1=0, 1, 2 . . . . For example, the first etching step could be with n−1=2, the second could be with n−1=0, and the third could be with n−1=1. The result will be the same structure as shown in FIG. 12. During typical operations half of the contact openings are etched during each etching step. When the number of levels which can be etched is equal to or greater than the number of levels which are etched, such as when five photoresist masks are used to etch 29 contact openings to reach 29 different landing pads 98, the masks will not all be used to etch to half of the contact openings, but rather will be used to etch to what will be referred to as effectively half of the contact openings.

Further information on techniques and methods for connecting electrical connectors 60 to landing pads 98 of electrical conductors 24 are disclosed in co-pending U.S. patent application Ser. No. 13/049,303, filed 16 Mar. 2011, entitled REDUCED NUMBER OF MASK FOR IC DEVICE WITH STACKED CONTACT LEVELS; and in U.S. patent application Ser. No. 13/114,931, filed 24 May 2011, entitled MULTILAYER CONNECTION STRUCTURE AND MAKING METHOD, the disclosures of which are incorporated by reference. These two applications have a common assignee with the present application.

FIGS. 19-21 are simplified plan views of three examples of die 12, each with one or more electrical contact region 18 and one or more regions of active device circuitry 20. The die 12 may all be the same or they could be different. For example, logic die such as CPU or controllers, could be used with memory die. In the example of FIG. 18, active device circuitry 20 constitutes a major portion of die 12 while electrical contact region 18 is positioned along one edge of die 12. In the example of FIG. 19, electrical contact region 18 is found at three different locations along three different sides of active device circuitry 20. In FIG. 20, there are two regions of active device circuitry 20 separated, in this example, by a single electrical contact region 18. It is expected that each die 12 will have many electrical contact regions like region 18 because one of the benefits of the stacked process is shorter connection path than with stacked chips using, for example, external bonding pads and connecting wires. It is expected that a minimum distance, such as 2 μm, be maintained between the one or more electrical contact regions 18 and active device circuitry 20. Such a minimum distance is likely to be required because of stresses induced by the process. Therefore, in some embodiments, the devices in one or more levels can include a wide I/O structuring, including many connectors, such as a hundred or more, between the levels. In other embodiments, fewer connectors between the levels are used.

An advantage of this invention is that it can be employed to create a three-dimensional, stacked multichip module, such as one including three-dimensional stacked memory devices, while drastically reducing the time and expense associated with the steps required to create conventional TSV stacked semiconductor devices. In addition, the invention reduces the required handling and processing of each die in comparison with conventional TSV procedures which can lead to improved yields. In addition to providing a thinner device, which is important for devices such as cell phones, the reduction in the thickness of the resulting stack of die 12 by the removal of lower portions 36 has several advantages. These advantages include reducing the length of the electrical connectors coupling electrical connectors 24 to one another and to landing pads 98, thus reducing the resistance and associated heat loss, and increasing speed.

Figure 22:
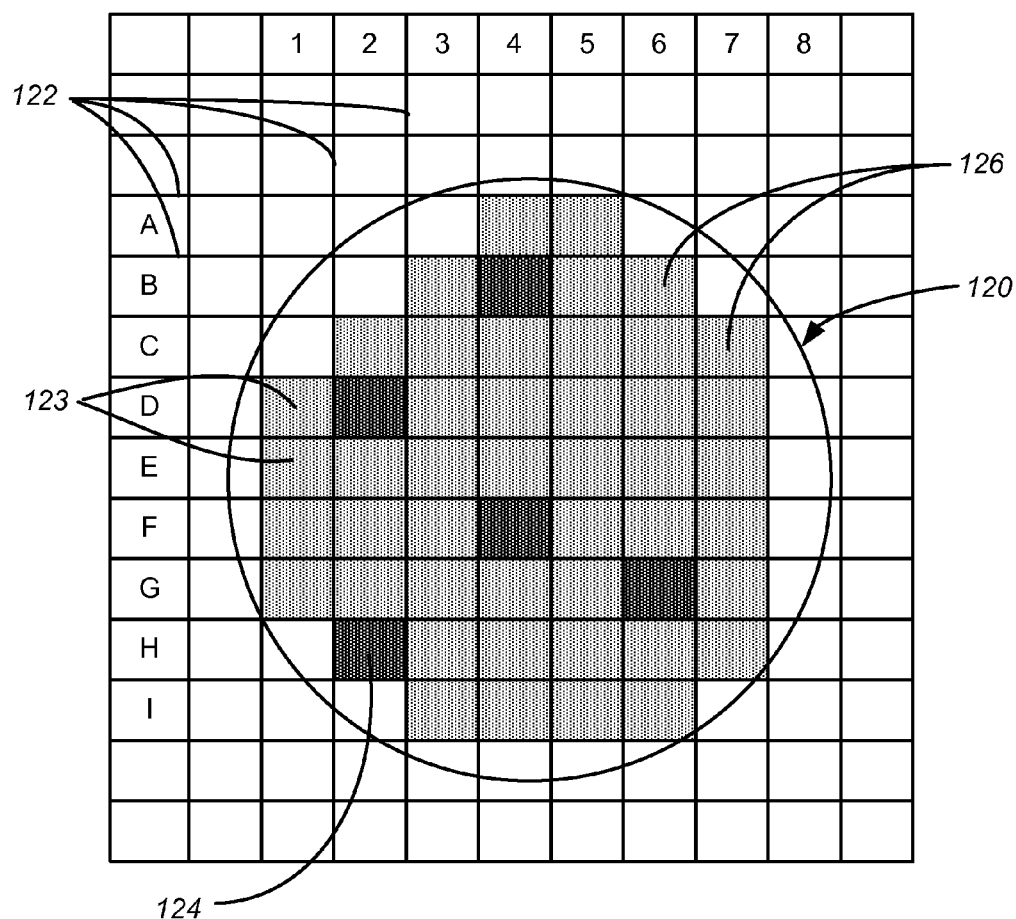
FIG. 22 is a top plan view of an IC wafer with a grid lines indicating die regions.
Figure 23:
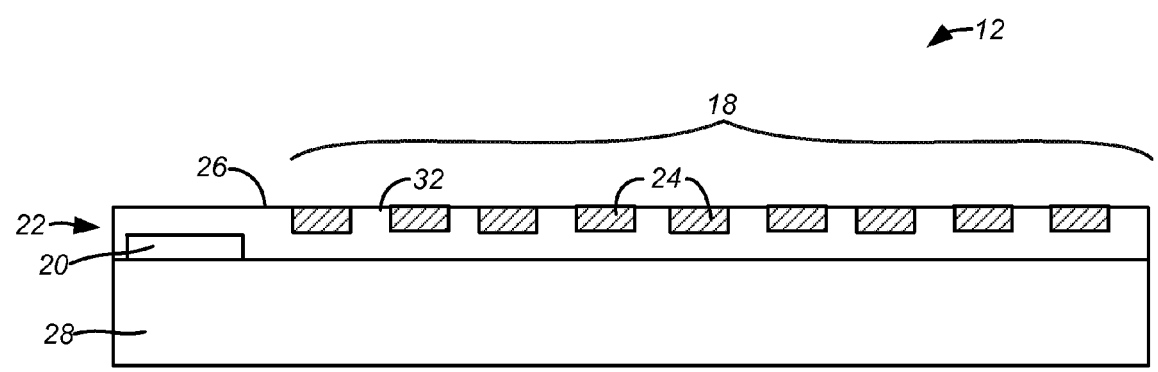
FIG. 23 is a side cross-sectional view of one of the die from the wafer of FIG. 22.

The invention can be carried out using die scale stacking procedures, such as those discussed above, and can also be carried out using wafer scale stacking procedures which results in additional advantages discussed below. FIG. 22 is a top plan view illustrating an integrated circuit wafer 120 with grid lines 122 indicating die regions 123 where individual die 12 will be created from wafer 120. FIG. 23 shows a simplified cross-sectional view of a typical die 12, substantially identical to die 12 of FIG. 1, from location C-7 on wafer 120. In this example there are a total of 50 die 12 to be created from wafer 120. For purposes of illustration, it is assumed that 5 of the die 12 are defective or bad die 124 as indicated by being cross-hatched in FIG. 22. In this case 90% of the die on wafer 120 would be good die 126 while 10% of die 120 would be bad die 124.

FIG. 24 illustrates an example in which four different IC wafers 120 each have 50 die regions 123 with 10% of die regions 123 being bad. If the IC wafers 120 are individually diced, then the good die can be selected and stacked using a die scale stacking technique resulting in a 90% yield for the stacked multichip modules 61. However, the need to individually process each multichip module 61 using die scale stacking techniques makes the processing much more expensive than processing on a wafer scale in which all 50 stacked multichip modules 61 are processed in unison.

IC wafers 120 of FIG. 24 are stacked to produce the third 3-D stacked wafer 56.1 of FIG. 25. Stacked wafer 56.1 has 15 of the die regions 123 marked with either a 2, indicating two out of the four stacked die are good die, or 3, indicating three out of the four stacked die are good die. No marking indicates that all levels are good die. If the four different IC wafers 120 are stacked, bonded to one another, diced and then processed in a conventional manner, such as using wirebonding techniques or TSV, each stacked multichip module with even one bad die would cause that stacked multichip module to be rejected as defective because all of the die need to be good for the stacked multichip module to be good. In this example the yield would be only 70% good stacked multichip modules, that is 35 out of 50. This technique would, however, eliminate the processing expenses associated with die scale stacking and processing techniques discussed in the paragraph immediately above.

With the present invention the stacked multi-die modules 61 which are partially defective can be segregated as non-perfect die. For example, if each die 12 is one core of a CPU, the non-perfect module 61 can be identified as a two core module 61 if there are two good die 12 or a three core module 61 if there are three good die 12. Similarly, if each die is a 1 GB memory die, the non-perfect modules 61 can be marked as 3 GB memory modules or 2 GB memory modules as the case may be. In this example there would be 35 good stacked multichip module 61 but also 5 non-perfect modules 61 with two good die 12 and 10 non-perfect modules 61 with three good die 12. The interconnection technology described herein enables isolation of the defective die in the stack, because of the individual connectors reaching to a single landing pad on one level of the stack. During the manufacturing process to stack the die and make the connectors, the defective die can be isolated from operable die, in one approach, using masks for the formation of the connectors that are selected according to the number and locations of the defective die in each stack. Being able to salvage the non-perfect module 61 helps to reduce cost over conventional wafer scale processing techniques.

The above descriptions may have used terms such as above, below, top, bottom, over, under, et cetera. These terms may be used in the description and claims to aid understanding of the invention and not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are incorporated by reference.

What is claimed is:

1. A method for creating a three-dimensional stacked multichip module comprising:
   providing a set of W integrated circuit die, W being an integer greater than 1, each die in the set comprising a patterned conductor layer, the patterned conductor layer comprising an electrical contact region, the electrical contact region comprising landing pads;
   mounting a handling die to a selected die in the set, over the patterned conductor layer;
   removing an exposed layer of the selected die to create an enhanced handling die;
   repeating the mounting and removing steps using the enhanced handling die in each iteration, and so that the landing pads on each die are aligned with those on the other die in the set, until all the die in the set are mounted, to create a three-dimensional stacked die; and
   forming connectors from a surface of the module though the three-dimensional stacked die to contacts in the aligned landing pads in each die in the set to create a three-dimensional stacked multichip module.

2. The method according to claim 1, wherein the forming step is carried out with at least some of the die comprising device circuitry at a device circuitry location spaced apart from the electrical contact region.

3. The method according to claim 1, wherein the mounting step further comprises depositing a dielectric, adhesion-enhancing layer between the handling die and the die.

4. The method according to claim 1, wherein the die providing step further comprises selecting a die comprising a substrate having a first side at which the patterned conductor region is located, and a second side opposite the first side.

5. The method according to claim 4, wherein the removing step comprises removing a portion of the second side of the substrate.

6. The method according to claim 1, further comprising removing at least a portion of the handling die from the three-dimensional stacked multichip module to create an exposed surface.

7. The method according to claim 1, wherein the connectors forming step comprises:
creating contact openings through said surface of the module, the contact openings overlying a landing pad of an electrical conductor for each die level;
selecting a set of N etch masks, N being selected so that $2^{N-1}$ is less than W and $2^N$ is greater than or equal to W;
using the N masks to etch the contact openings to the W die levels, the N masks using step comprising etching $2^{n-1}$ die levels for effectively half of the contact openings for each mask n=1, 2 . . . N; and
whereby electrical conductors can be formed in the contact openings to electrically contact landing pads at each of the die levels.

8. The method according to claim 7:
further comprising covering said surface of the module with a dielectric material following the handling die removing step; and
wherein the contact openings creating step further comprises removing at least a portion of the dielectric material.

9. The method according to claim 7, wherein the N etch masks using step further comprises alternatingly covering and exposing $2^{n-1}$ landing pads for each mask n=1, 2 . . . N.

10. A method for creating a plurality of three-dimensional stacked multichip modules comprising:
providing a set of W integrated circuit wafers, W being an integer greater than 1, each wafer in the set comprising a grid of die regions, each die region comprising an integrated circuit die comprising a patterned conductor layer, the patterned conductor layer comprising an electrical contact region, the electrical contact region comprising landing pads;
mounting a handling wafer to a selected wafer in the set, over the patterned conductor layers;
removing an exposed layer of the selected wafer to create an enhanced handling wafer;
repeating the mounting and removing steps using the enhanced handling wafer in each iteration, and so that the landing pads on each die are aligned with those on the other die in the set of integrated circuit wafers, until all the wafers in the set are mounted, to create a three-dimensional stacked wafer comprising a grid of three-dimensional stacked die;
forming connectors from a surface of the three-dimensional stacked wafer to contacts in the aligned landing pads to create a grid of three-dimensional stacked multi-chip modules;
physically separating the grid of three-dimensional stacked multi-chip modules into individual three-dimensional stacked multi-chip modules.

11. The method according to claim 10, wherein the connectors forming step further comprises:
creating contact openings through said surface of the three-dimensional stacked wafer, the contact openings overlying landing pads of electrical conductors for each die level of a plurality of the three-dimensional stacked multi-chip modules;
selecting a set of N etch masks, N being selected so that $2^{N-1}$ is less than W and $2^N$ is greater than or equal to W;
using the N masks to etch the contact openings to the W die levels, the N masks using step comprising etching $2^{n-1}$ die levels for effectively half of the contact openings for each mask n=1, 2 . . . N; and
whereby electrical conductors can be formed in the contact openings to electrically contact landing pads at each of the die levels.

12. The method according to claim 11, wherein the N etch masks using step further comprises alternatingly covering and exposing $2^{n-1}$ landing pads for each mask n=1, 2 . . . N contact openings to electrically contact landing pads at each of the die levels.

* * * * *